(12) United States Patent
Park et al.

(10) Patent No.: US 10,515,798 B2
(45) Date of Patent: Dec. 24, 2019

(54) METHOD OF FABRICATING DEVICE INCLUDING TWO-DIMENSIONAL MATERIAL

(71) Applicant: Samsung Electronics Co., Ltd., Suwon-si, Gyeonggi-do (KR)

(72) Inventors: Tae-jin Park, Yongin-si (KR); Bong-soo Kim, Yongin-si (KR); Jin-bum Kim, Seoul (KR); Yoo-sang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/120,775

(22) Filed: Sep. 4, 2018

(65) Prior Publication Data

US 2019/0074180 A1    Mar. 7, 2019

(30) Foreign Application Priority Data

Sep. 4, 2017 (KR) .................. 10-2017-0112494

(51) Int. Cl.

| | | |
|---|---|---|
| *H01L 21/02* | (2006.01) | |
| *H01L 29/786* | (2006.01) | |
| *H01L 29/06* | (2006.01) | |
| *H01L 29/423* | (2006.01) | |
| *H01L 29/66* | (2006.01) | |
| *H01L 29/78* | (2006.01) | |
| *H01L 29/778* | (2006.01) | |

(Continued)

(52) U.S. Cl.
CPC .. *H01L 21/02568* (2013.01); *H01L 21/02587* (2013.01); *H01L 29/0665* (2013.01); *H01L 29/42384* (2013.01); *H01L 29/66045* (2013.01); *H01L 29/66969* (2013.01); *H01L 29/778* (2013.01); *H01L 29/7788* (2013.01); *H01L 29/7789* (2013.01); *H01L 29/7853* (2013.01); *H01L 29/78603* (2013.01); *H01L 29/78642* (2013.01); *H01L 29/78696* (2013.01); *H01L 21/0243* (2013.01); *H01L 21/02488* (2013.01); *H01L 21/02494* (2013.01); *H01L 21/02513* (2013.01); *H01L 21/02612* (2013.01); *H01L 29/1606* (2013.01); *H01L 29/2003* (2013.01); *H01L 29/24* (2013.01); *H01L 29/4236* (2013.01)

(58) Field of Classification Search
None
See application file for complete search history.

(56) References Cited

U.S. PATENT DOCUMENTS 9,276,092 B1    3/2016 Karda et al.
9,472,401 B2    10/2016 Chiappe
(Continued)

*Primary Examiner* — Asok K Sarkar
(74) *Attorney, Agent, or Firm* — Harness, Dickey & Pierce, P.L.C.

(57) ABSTRACT

A method of fabricating a device including a two-dimensional (2D) material includes forming a transition metal oxide pattern on a substrate and forming a transition metal dichalcogenide layer on a top surface and a side surface of a residual portion of the transition metal oxide pattern. The forming the transition metal dichalcogenide layer may include replacing a surface portion of the transition metal oxide pattern with the transition metal dichalcogenide layer. The transition metal dichalcogenide layer includes at least one atomic layer that is substantially parallel to a surface of the residual portion of the transition metal oxide pattern.

20 Claims, 26 Drawing Sheets

(51) Int. Cl.
*H01L 29/24* (2006.01)
*H01L 29/16* (2006.01)
*H01L 29/20* (2006.01)

(56) References Cited

U.S. PATENT DOCUMENTS

| | | |
|---|---|---|
| 9,576,950 B1 | 2/2017 | Yeo et al. |
| 9,620,665 B1 | 4/2017 | Bartolucci et al. |
| 9,658,186 B2 | 5/2017 | Yang et al. |
| 9,673,390 B2 | 6/2017 | Reed et al. |
| 2016/0093491 A1 | 3/2016 | Choi et al. |
| 2016/0233322 A1 | 8/2016 | Yeh et al. |
| 2017/0011916 A1 | 1/2017 | Lee et al. |
| 2018/0358474 A1* | 12/2018 | Li .................. H01L 29/78696 |

\* cited by examiner

METHOD OF FABRICATING DEVICE INCLUDING TWO-DIMENSIONAL MATERIAL

CROSS-REFERENCE TO RELATED APPLICATION

This application claims the benefit of Korean Patent Application No. 10-2017-0112494, filed on Sep. 4, 2017, in the Korean Intellectual Property Office, the disclosure of which is incorporated herein in its entirety by reference.

BACKGROUND

Inventive concepts relate to a method of fabricating a device including a two-dimensional (2D) material, and more particularly, to a method of fabricating a device including a pattern of the 2D material (hereinafter, referred to as a 2D material pattern).

Since the successful separation of graphene from graphite, intensive research has been conducted into 2D materials, such as graphene, hexagonal boron nitride (h-BN), and transition metal dichalcogenide (TMDC). The 2D materials may be formed to have only one to several atomic layers. The 2D materials may not only have a small thickness of several nanometers (nm) or less, but may also have better electrical, optical, and chemical properties than related art materials that have three-dimensional (3D) crystal structures. Therefore, the 2D materials have attracted attention as new materials for electronic devices and optical devices.

SUMMARY

Inventive concepts provides a method of fabricating a device including a two-dimensional (2D) material pattern.

According to an aspect of inventive concepts, a method of fabricating a device including a 2D material may include forming a transition metal oxide pattern on a substrate and forming a transition metal dichalcogenide layer on a top surface and a side surface of a residual portion of the transition metal oxide pattern. The forming the transition metal dichalcogenide layer may include replacing a surface portion of the transition metal oxide pattern with the transition metal dichalcogenide layer. The transition metal dichalcogenide layer may have at least one atomic layer that is substantially parallel to a surface of the residual portion of the transition metal oxide pattern.

According to another aspect of inventive concepts, a method of fabricating a device including a 2D material may include forming a material pattern on a substrate, forming a 2D material layer on a residual portion of the material pattern, and forming a pair of 2D material patterns on a pair of opposite side surface of the residual portion of the material pattern. The forming the 2D material layer may include replacing a surface portion of the material pattern with the 2D material layer. The forming the pair of 2D material patterns may include removing a portion of the 2D material layer.

According to another aspect of inventive concepts, a method of fabricating a device including a 2D material may include forming a pair of lower electrodes on a substrate, forming a material pattern in contact with the pair of lower electrodes, forming a 2D material layer on a residual portion of the material pattern, forming a pair of 2D material patterns and a pair of gate structures contacting the pair of 2D material patterns, and forming a pair of upper electrodes on end part of the pair of 2D material patterns that are opposite end portions of the pair of 2D material patterns contacting the pair of lower electrodes. The forming the 2D material layer may include replacing a surface portion of the material pattern with the 2D material layer.

According to another aspect of inventive concepts, there is provided a method of fabricating a device including a 2D material. The method includes forming an amorphous transition metal oxide structure on a substrate, and replacing the amorphous transition metal oxide structure with a transition metal dichalcogenide structure. The transition metal dichalcogenide structure includes atomic layers that are substantially parallel to a surface of the transition metal dichalcogenide structure.

According to another aspect of inventive concepts, there is provided a method of fabricating a device including a 2D material. The method includes forming a recess in a substrate, the recess being depressed from a main surface of the substrate, covering the recess of the substrate and the main surface of the substrate with a material layer, and replacing the material layer with a 2D material layer. The 2D material layer includes a first portion on a bottom surface of the recess of the substrate, a second portion on a side surface of the recess of the substrate, and a third portion on the main surface of the substrate, and atomic layers of the second portion of the 2D material layer may be substantially perpendicular to the main surface of the substrate.

According to another aspect of inventive concepts, there is provided a method of fabricating a device including a 2D material. The method includes forming a transition metal oxide layer on a substrate, forming a material pattern on a portion of the transition metal oxide layer, and replacing a portion of the transition metal oxide layer, which is not covered with the material pattern, with a transition metal dichalcogenide pattern. The transition metal dichalcogenide pattern includes atomic layers that are substantially parallel to a main surface of the substrate.

BRIEF DESCRIPTION OF THE DRAWINGS

Embodiments of inventive concepts will be more clearly understood from the following detailed description taken in conjunction with the accompanying drawings in which:

FIGS. 1A to 5A are plan views of a method of fabricating a device including a two-dimensional (2D) material according to an embodiment;

FIGS. 1B to 5B are cross-sectional views of a method of fabricating a device including a 2D material, according to an embodiment, which are taken along lines AA' of FIGS. 1A to 5A, respectively;

DETAILED DESCRIPTION

FIGS. 1A to 5A are plan views of a method of fabricating a device including a two-dimensional (2D) material, according to an embodiment. FIGS. 1B to 5B are cross-sectional views of a method of fabricating a device including a 2D material, according to an embodiment, which are taken along lines AA' of FIGS. 1A to 5A, respectively.

Figure 1A:
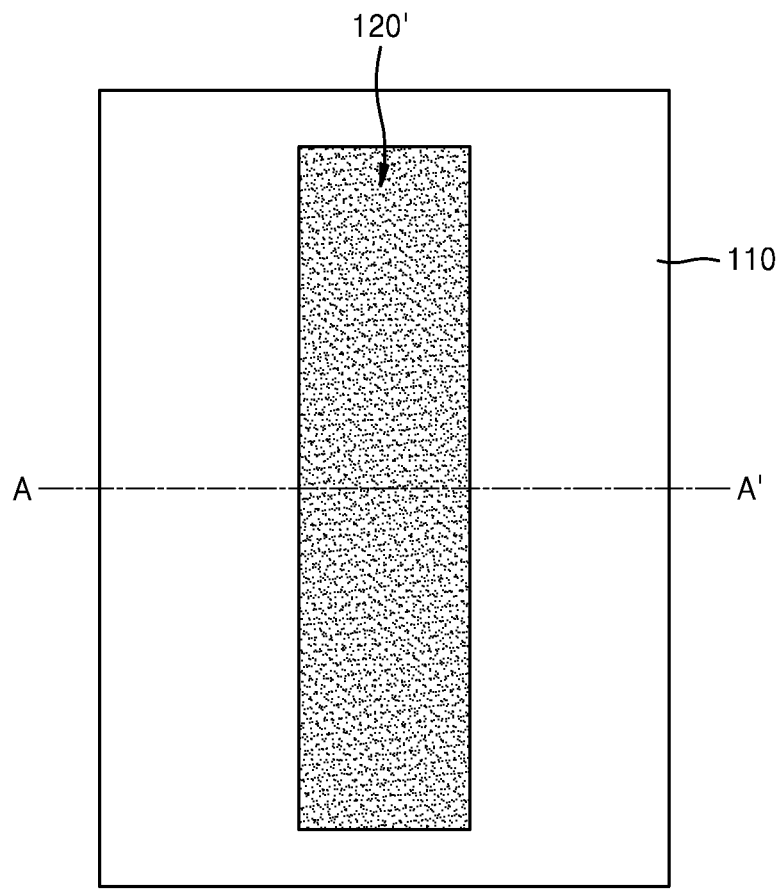
Figure 1B:
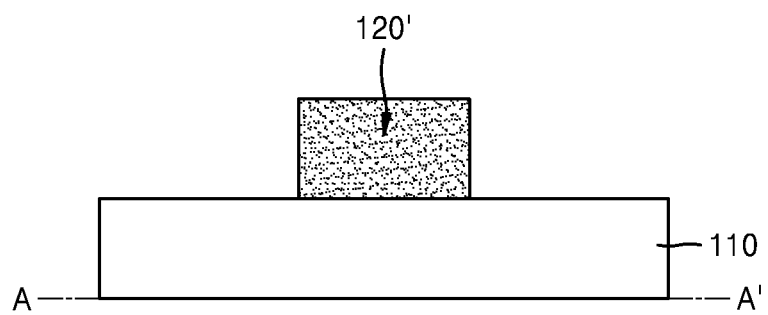

Referring to FIGS. 1A and 1B, a material pattern 120' may be formed on a substrate 110. The substrate 110 may include, for example, glass, plastic, or a semiconductor. The semiconductor may be, for example, a Group-IV semiconductor, such as silicon (Si), germanium (Ge), and silicon-germanium (Si—Ge), a Group III-V semiconductor, such as gallium arsenide (GaAs), indium phosphide (InP), gallium phosphide (GaP), indium arsenide (InAs), indium antimonide (InSb), or indium gallium arsenide (InGaAs), or a Group II-VI semiconductor, such as zinc telluride (ZnTe) or cadmium sulfide (CdS). The substrate 110 including a semiconductor may be a bulk wafer or an epitaxial layer. The substrate 110 may be a semiconductor-on-insulator substrate.

The material pattern 120' may include a source material for the synthesis of a 2D material. The material pattern 120' may include a metal or a metal oxide. The material pattern 120' may include, for example, a transition metal, such as one of copper (Cu), nickel (Ni), molybdenum (Mo), tungsten (W), titanium (Ti), vanadium (V), zirconium (Zr), hafnium (Hf), palladium (Pd), platinum (Pt), niobium (Nb), tantalum (Ta), technetium (Tc), rhenium (Re), or a combination thereof.

In an embodiment, the material pattern 120' may include a transition metal oxide. For example, the material pattern 120' may include a transition metal dioxide, such as molybdenum dioxide ($MoO_2$) or tungsten dioxide ($WO_2$), or a transition metal trioxide, such as molybdenum trioxide ($MoO_3$) or tungsten trioxide ($WO_3$). As used herein, the material pattern 120' including the transition metal oxide may be referred to as a transition metal oxide pattern. In some embodiments, the transition metal oxide pattern may include crystalline molybdenum dioxide.

Figure 2A:
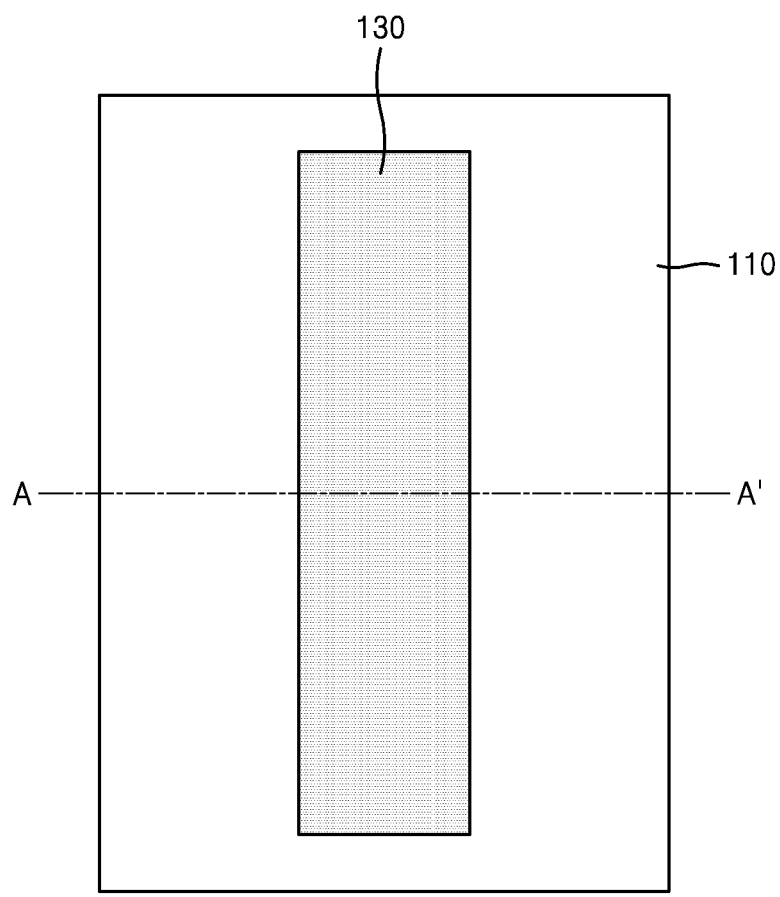
Figure 2B:
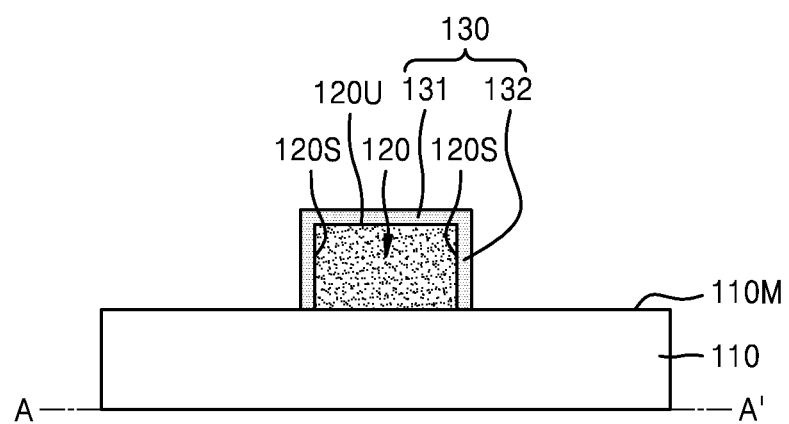

Referring to FIGS. 2A and 2B, a surface portion of the material pattern 120' (refer to FIGS. 1A and 1B) may be replaced by a 2D material layer 130 so that the 2D material layer 130 may be formed on a material-pattern residual portion 120.

The 2D material layer 130 may include, for example, a 2D material, such as graphene, hexagonal boron nitride (h-BN), or a transition metal dichalcogenide (TMDC). A formula for the TMDC may be $MX_2$, and M may be a transition metal element, such as molybdenum (Mo), tungsten (W), nickel (Ni), titanium (Ti), vanadium (V), zirconium (Zr), hafnium (Hf), palladium (Pd), platinum (Pt), niobium (Nb), tantalum (Ta), technetium (Tc), or rhenium (Re), and X may be a chalcogen element, such as sulfur (S), selenium (Se), or tellurium (Te). Herein, the 2D material layer 130 including the TMDC may be referred to as a TMDC layer. Also, the 2D material layer 130 may be doped with an n-type dopant or a p-type dopant. The n-type dopant or the p-type dopant may be doped using an ion implantation process or a chemical doping process.

The 2D material layer 130 may have one to several tens of atomic layers (e.g., in a range of 1 to 90, 1 to 30, 1 to 10, and/or 1-3 atomic layers). When the 2D material layer 130 has a plurality of atomic layers, the plurality of atomic layers may be parallel to each other. Each of the atomic layers included in the 2D material layer 130 may be substantially parallel to a surface of a material-pattern residual portion 120. For example, each of the atomic layers of a first portion 131 of the 2D material layer 130 on a top surface 120U of the material-pattern residual portion 120 may be parallel to the top surface 120U of the material-pattern residual portion 120. The top surface 120U of the material-pattern residual portion 120 may be substantially parallel to a main surface 110M of the substrate 110. In this case, each of the atomic layers of the first portion 131 of the 2D material layer 130 may be substantially parallel to the main surface 110M of the substrate 110. Also, each of the atomic layers of the second portion 132 of the 2D material layer 130 on a side surface 120S of the material-pattern residual portion 120 may be parallel to the side surface 120S of the material-pattern residual portion 120. The side surface 120S of the material-pattern residual portion 120 may be substantially perpendicular to the main surface 110M of the substrate 110. In this case, each of the atomic layers of the second portion 132 of the 2D material layer 130 may be substantially perpendicular to the main surface 110M of the substrate 110.

The formation of the 2D material layer 130 may include supplying a reactant to a surface of the material pattern 120' (refer to FIGS. 1A and 1B) and forming the 2D material layer 130 by a reaction of the reactant with the material pattern 120' (refer to FIGS. 1A and 1B). For example, the 2D material layer 130 including the TMDC may be formed by a reaction of the surface portion of the material pattern 120' (refer to FIGS. 1A and 1B) including a transition metal oxide with a reactant including a chalcogen element.

The reaction of the surface portion of the material pattern 120' (refer to FIGS. 1A and 1B) with the reactant may be a reaction of replacing one of the elements included in the surface portion of the material pattern 120' (refer to FIGS. 1A and 1B) with an element of the same group as the replaced element in the periodic table. For example, the reaction of the surface portion of the material pattern 120' (refer to FIGS. 1A and 1B) with the reactant may be a reaction of replacing oxygen (O) of the transition metal oxide with sulfur (S) or another chalcogen element.

According to an embodiment, the 2D material layer 130 including molybdenum disulfide ($MoS_2$) may be formed by a sulfurization reaction of the surface of the material pattern 120' (refer to FIGS. 1A and 1B) including a crystalline molybdenum dioxide ($MoO_2$) with sulfur (S) vapor. During a sulfurization reaction of the crystalline molybdenum dioxide ($MoO_2$) with sulfur (S) vapor, a process temperature (or a reaction temperature) may be lower than a sublimation temperature of the crystalline molybdenum dioxide ($MoO_2$). For example, the reaction temperature may range from about 400° C. to about 1100° C. Since the crystalline molybdenum dioxide ($MoO_2$) remains in a solid state at the reaction temperature, the 2D material layer 130 including molybdenum disulfide ($MoS_2$) may be formed to a uniform, small thickness on the material-pattern residual portion 120. Also, the 2D material layer 130 may be formed to a uniform, small thickness due to a strong molybdenum-oxygen (Mo—O) bond. Furthermore, as a reaction time increases, the thickness of the 2D material layer 130 may increase, and the number of atomic layers included in the 2D material layer 130 may increase. Thus, the number of atomic layers included in the 2D material layer 130 may be controlled by adjusting the reaction time.

Figure 3A:
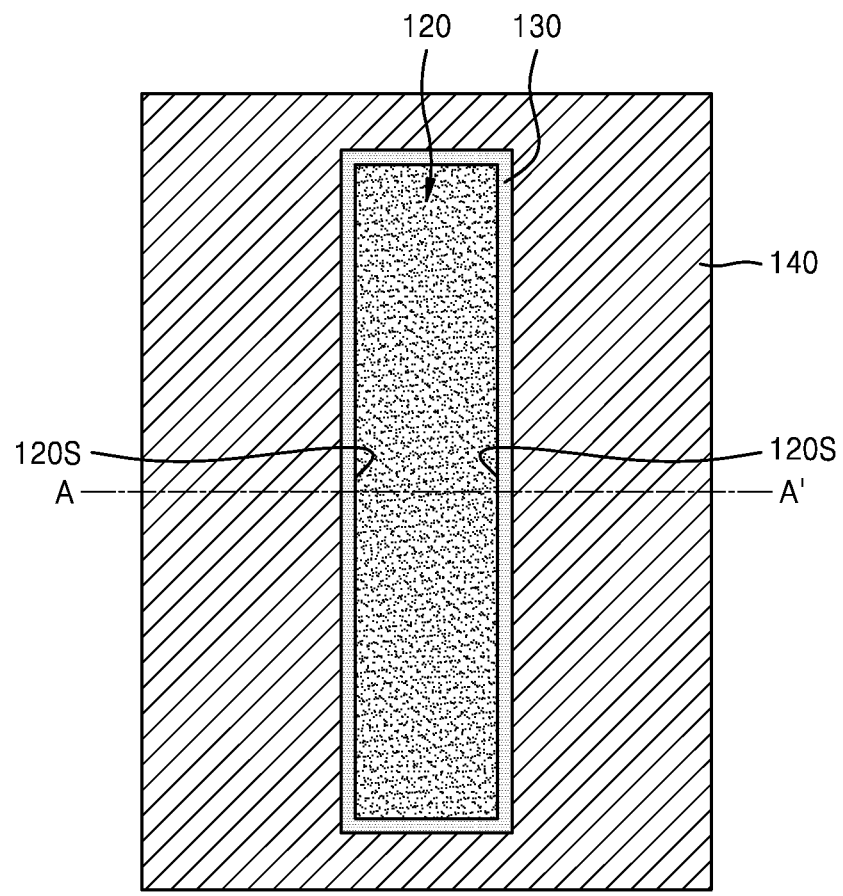
Figure 3B:
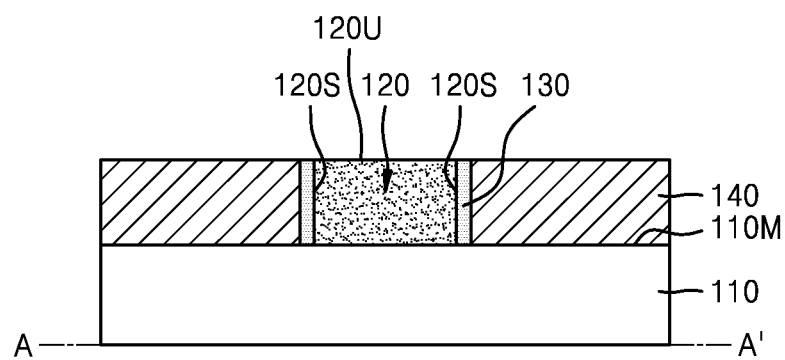

Referring to FIGS. 3A and 3B, a portion (e.g., the first portion 131 (refer to FIG. 2B)) of the 2D material layer 130, which is formed on the top surface 120U of the material-pattern residual portion 120, may be removed. For example, the substrate 110 and the 2D material layer 130 may be covered with a cover layer 140, and an upper portion of the cover layer 140 and the portion (e.g., the first portion 131 (refer to FIG. 2B)) of the 2D material layer 130, which is formed on the top surface 120U of the material-pattern residual portion 120, may be polished to expose the top surface 120U of the material-pattern residual portion 120. The cover layer 140 may include an insulating material, such as silicon oxide, silicon nitride, or silicon oxynitride. The cover layer 140 may be deposited using, for example, a chemical vapor deposition (CVD) process, a physical vapor deposition (PVD) process, a plasma-enhanced CVD (PECVD) process, or an atomic layer deposition (ALD) process. The polishing process may be performed using, for example, a chemical mechanical polishing (CMP) process.

Figure 4A:
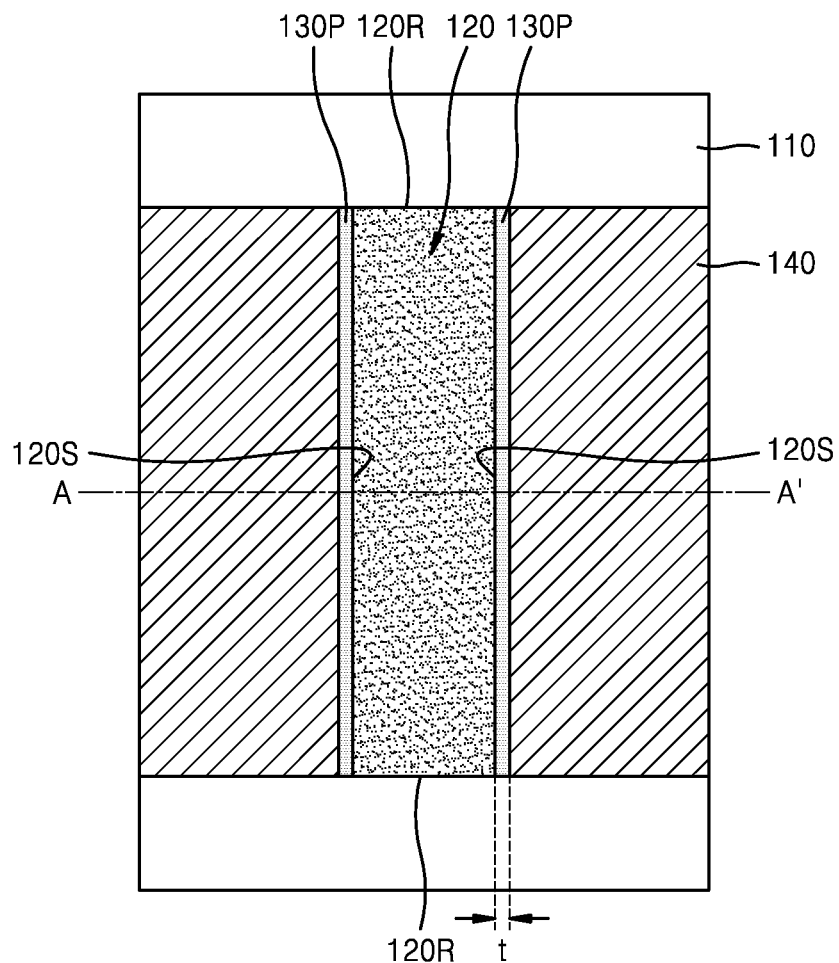
Figure 4B:
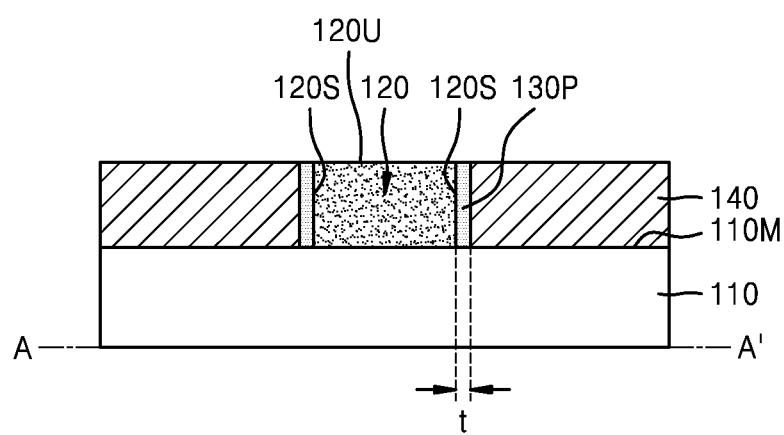

Referring to FIGS. 4A and 4B, portions of the 2D material layer 130 may be removed to leave only portions of the 2D material layer 130, which are formed on a pair of opposite side surfaces 120S of the material-pattern residual portion 120. That is, portions of the 2D material layer 130, which are formed on another pair of opposite side surfaces 120R of the material-pattern residual portion 120, may be removed. The removal process may be performed using, for example, a lithography process and an etching process. Portions of the 2D material layer 130 may be removed, thereby forming a pair of 2D material patterns 130P on the pair of opposite side surfaces 120S of the material-pattern residual portion 120.

Each of the pair of opposite side surfaces 120S of the material-pattern residual portion 120 may be substantially perpendicular to the main surface 110M of the substrate 110. Each of the pair of 2D material patterns 130P formed on the pair of side surfaces 120S of the material-pattern residual portion 120 may have at least one atomic layer, which is substantially perpendicular to the main surface 110M of the substrate 110.

Figure 5A:
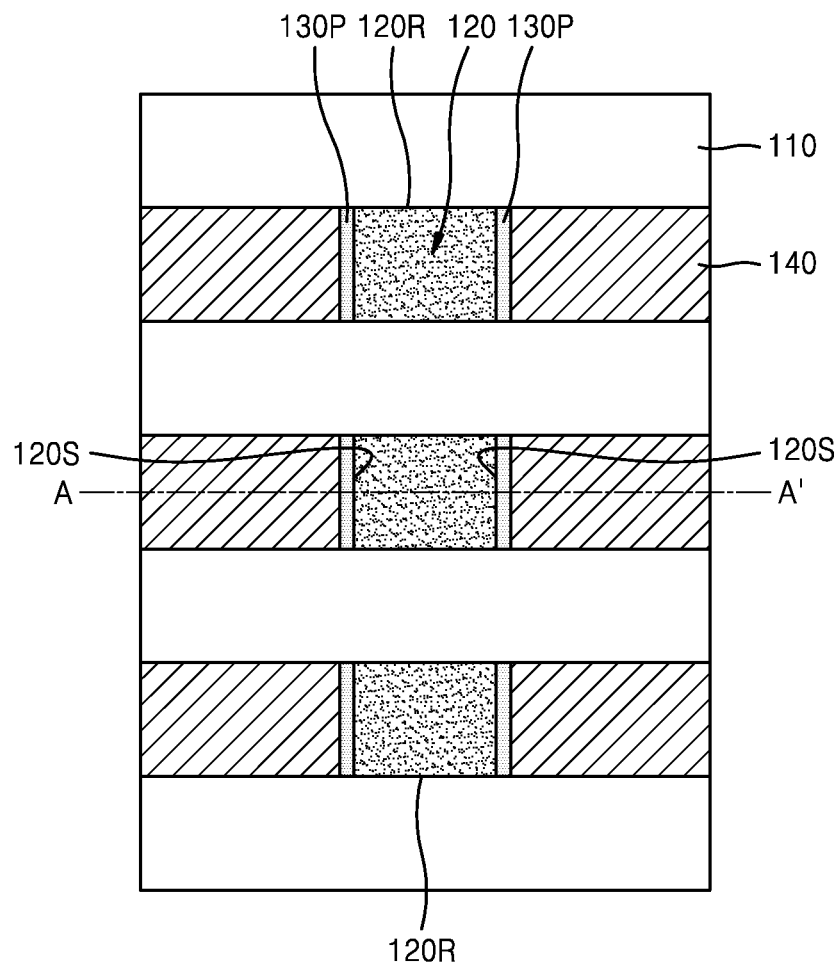
Figure 5B:
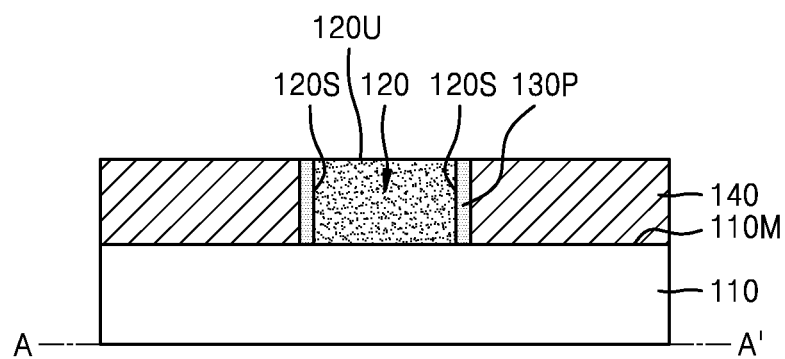

After the operation shown in FIGS. 3A and 3B is performed, the operation shown in FIGS. 5A and 5B may be performed instead of the operation shown in FIGS. 4A and 4B. Referring to FIGS. 5A and 5B, a plurality of pairs of 2D material patterns 130P may be formed at the same time. A plurality of masks (not shown), which are spaced apart from each other, may be formed to be orthogonal to the material-pattern residual portion 120. Portions of the material-pattern residual portion 120 and the 2D material layer 130, which is not covered with the plurality of masks, may be removed, thereby forming a plurality of pairs of 2D material patterns 130P. The removal process may be performed using, for example, a lithography process and an etching process.

According to the fabrication method of the present embodiment, at least one pair of 2D material patterns 130P may be formed using one material pattern 120' (refer to FIGS. 1A and 1B. A thickness 't' of the 2D material pattern 130P in one direction (refer to FIGS. 4A and 4B) may be very small because the thickness 't' is only a thickness of one to several tens of atomic layers. For example, when the 2D material layer 130 includes only one atomic layer, the thickness 't' of the 2D material pattern 130P in one direction may range from about 0.5 nm to about 0.8 nm.

A 2D material included in the 2D material pattern 130P may be a semiconductor. Accordingly, the 2D material pattern 130P may be used as a channel of a semiconductor device. Since one to several tens of atomic layers included in the 2D material pattern 130P are substantially perpendicular to the main surface 110M of the substrate 110, the 2D material pattern 130P may be used for a semiconductor device having a vertical channel.

In addition, a bandgap energy of a material included in the material-pattern residual portion 120 may be higher than a bandgap energy of the 2D material pattern 130P. For example, the material-pattern residual portion 120 including molybdenum dioxide ($MoO_2$) may have a bandgap energy of about 3.9 eV or higher, and the 2D material pattern 130P including molybdenum disulfide ($MoS_2$) may have a bandgap energy of about 2.1 eV or lower, which is lower than the bandgap of the material-pattern residual portion 120. As the number of atomic layers included in the 2D material pattern 130P increases, the bandgap energy of the 2D material pattern 130P may be further reduced. An electrical conductivity of the material-pattern residual portion 120 may be lower than that of the 2D material pattern 130P. Accordingly, when the 2D material pattern 130P is used as a semiconductor channel of the semiconductor device, the material-pattern residual portion 120 may not be removed but used as an insulating layer of the semiconductor device. However, according to some embodiments, the material-pattern residual portion 120 may be removed, and another material may be used as an insulating layer.

FIGS. 6A to 6I are cross-sectional views of a method of fabricating a device including a 2D material, according to an embodiment. Hereinafter, a method of fabricating a transistor using the processes shown in FIGS. 1A to 5B will be described with reference to FIGS. 6A to 6I.

Figure 6A:
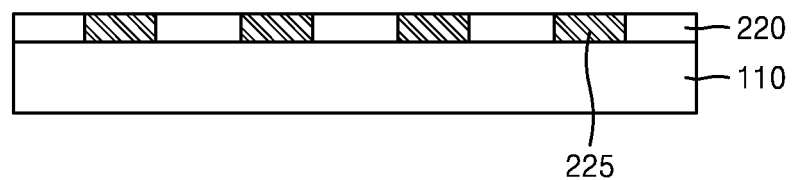
FIGS. 6A to 6I are cross-sectional views of a method of fabricating a device including a 2D material, according to an embodiment.

Referring to FIG. 6A, a pair of lower electrodes 225 and a first interlayer insulating layer 220 may be formed on a substrate 110.

The pair of lower electrodes 225 may include, for example, a conductive material, such as one of copper (Cu), tungsten (W), gold (Au), silver (Ag), or a combination thereof. The first interlayer insulating layer 220 may include an insulating material, such as silicon oxide, silicon nitride, silicon oxynitride, or a combination thereof.

Figure 6B:
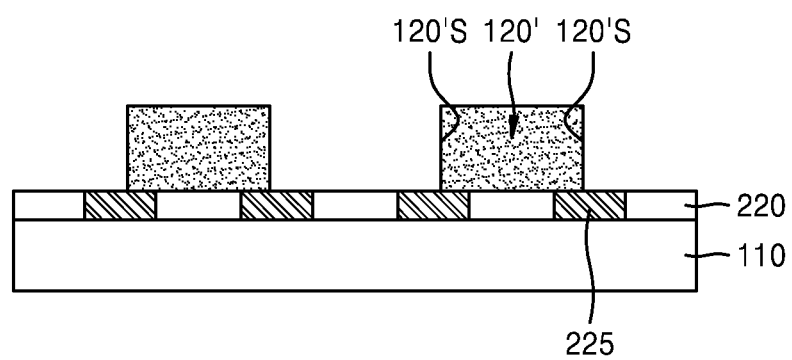

Referring to FIG. 6B, a material pattern 120' may be formed. A pair of opposite side surfaces 120'S of one material pattern 120' may be located on the pair of lower electrodes 225, respectively. A detailed description of the operation of forming the material pattern 120' may be the same as described with reference to FIGS. 1A and 1B.

Figure 6C:
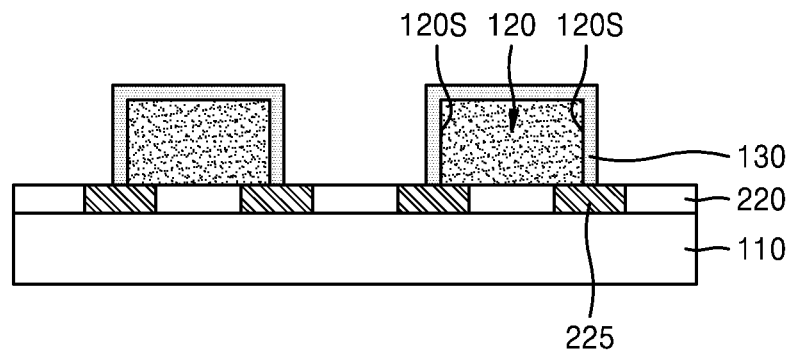

Referring to FIG. 6C, a 2D material layer 130 may be formed on a material-pattern residual portion 120. A detailed description of the operation of forming the 2D material layer 130 is the same as described with reference to FIGS. 2A and 2B.

Figure 6D:
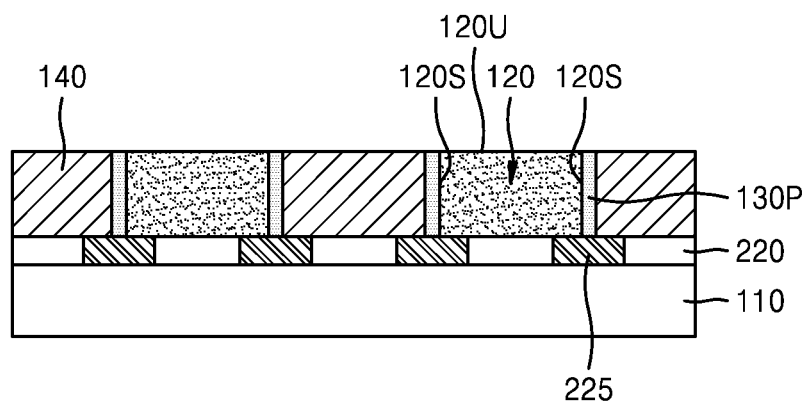

Referring to FIG. 6D, portions of the 2D material layer 130 may be etched to form a pair of 2D material patterns 130P, which may extend from the pair of lower electrodes 225 along a pair of opposite side surfaces 120S of the material-pattern residual portion 120. A detailed description of the operation of forming the 2D material patterns 130P is the same as described with reference to FIGS. 3A to 5B.

Figure 6E:
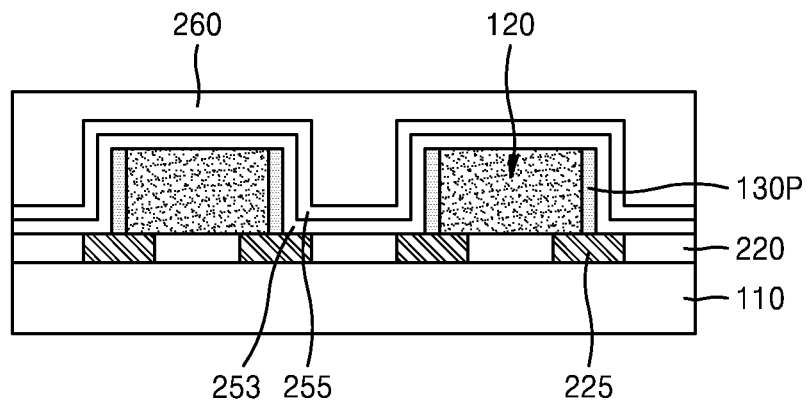

Referring to FIG. 6E, a cover layer 140 (refer to FIG. 6D), which has been used during the operation of etching the 2D material layer 130, may be removed, and a gate insulating layer 253, a gate electrode layer 255, and a filling insulating layer 260 may be sequentially formed in a space from which the cover layer 140 (refer to FIG. 6D) is removed. The gate insulating layer 253 may include, for example, a dielectric material, such as one of hafnium oxide ($HfO_2$), zirconium oxide ($ZrO_2$), lanthanum oxide ($La_2O_3$), tantalum oxide ($Ta_2O_5$), yttrium oxide ($Y_2O_3$), aluminum oxide ($Al_2O_3$), or a combination thereof. The gate electrode layer 255 may include, for example, a conductive material, such as one of titanium (Ti), tantalum (Ta), aluminum (Al), tungsten (W), ruthenium (Ru), niobium (Ni), molybdenum (Mo), hafnium (Hf), nickel (Ni), cobalt (Co), platinum (Pt), palladium (Pd), a combination thereof, or a nitride thereof. The filling insulating layer 260 may include an insulating material, such as one of silicon oxide, silicon nitride, silicon oxynitride, or a combination thereof. The gate insulating layer 253, the gate electrode layer 255, and the filling insulating layer 260 may be deposited using, for example, a CVD process, a PVD process, a PECVD process, or an ALD process.

Figure 6F:
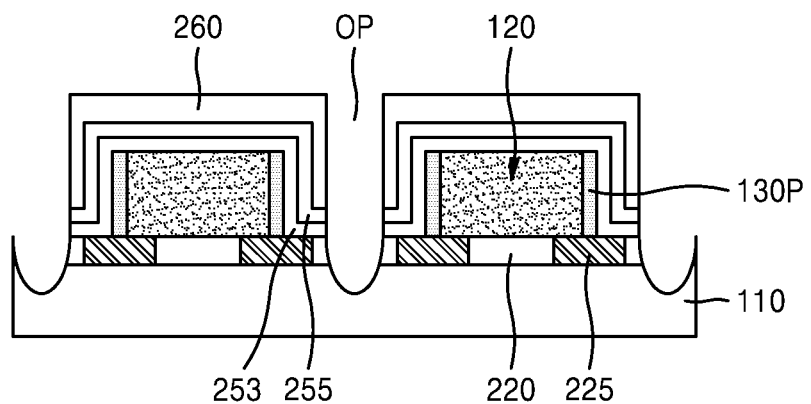

Referring to FIG. 6F, an opening OP may be formed to penetrate the gate insulating layer 253, the gate electrode layer 255, and the filling insulating layer 260. The opening OP may optionally penetrate the first interlayer insulating layer 220. The formation of the opening OP may be performed using a lithography process and an etching process.

Figure 6G:
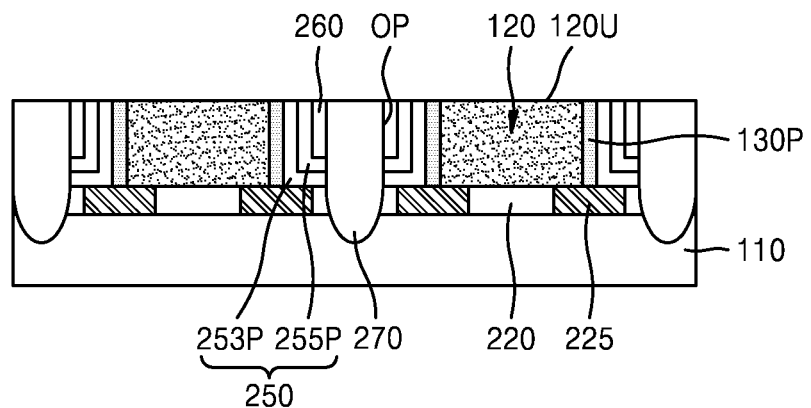

Referring to FIG. 6G, an isolation film 270 and a gate structure 250 may be formed. To begin with, the isolation film 270 may be formed to fill the opening OP. The isolation film 270 may include an insulating material, such as silicon oxide, silicon nitride, or silicon oxynitride. The isolation film 270 may be deposited using, for example, a CVD process, a PVD process, a PECVD process, or an ALD process. Next, the gate insulating layer 253, the gate electrode layer 255, the filling insulating layer 260, and the isolation film 270 may be polished to expose a top surface 120U of the material-pattern residual portion 120, thereby forming a gate structure 250 including a gate insulating pattern 253P and a gate electrode pattern 255P. The polishing process may be performed using, for example, a CMP process.

Figure 6H:
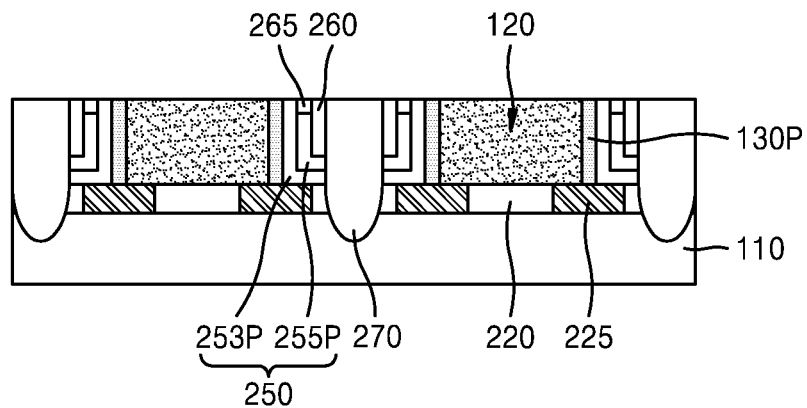

Referring to FIG. 6H, an upper portion of the gate electrode pattern 255P of the gate structure 250 may be removed. The process of removing the upper portion of the gate electrode pattern 255P of the gate structure 250 may be performed using, for example, an etchback process. A filling insulating pattern 265 may be formed in a space from which the upper portion of the gate electrode pattern 255P is removed. The filling insulating pattern 265 may include an insulating material, such as silicon oxide, silicon nitride, or silicon oxynitride.

Figure 6I:
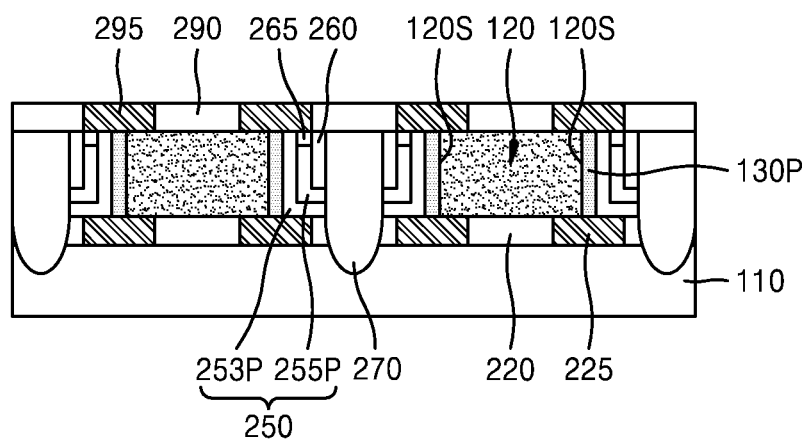

Referring to FIG. 6I, an upper electrode 295 and a second interlayer insulating layer 290 may be formed. A pair of upper electrodes 295 may be formed on end portions opposite to end portions of the pair of 2D material patterns 130P contacting the pair of lower electrodes 225. A detailed description of the upper electrode 295 and the second interlayer insulating layer 290 may be the same as that of the lower electrode 225 and the first interlayer insulating layer 220 described with reference to FIG. 6A.

A semiconductor device fabricated according to an embodiment may include a pair of transistors, each of which may include the 2D material pattern 130P, the lower electrode 225, the upper electrode 295, and the gate structure 250. The pair of transistors may be spaced apart from each other with the material-pattern residual portion 120 therebetween. The 2D material pattern 130P may extend along the side surface 120S of the material-pattern residual portion 120, and the lower electrode 225 and the upper electrode 295 may be respectively located at both ends of the 2D material pattern 130P. The gate structure 250 including the gate electrode pattern 255P and the gate insulating pattern 253P may be located at a side of the 2D material pattern 130P, which is opposite to a side that is in contact with the material-pattern residual portion 120.

Figure 7A:
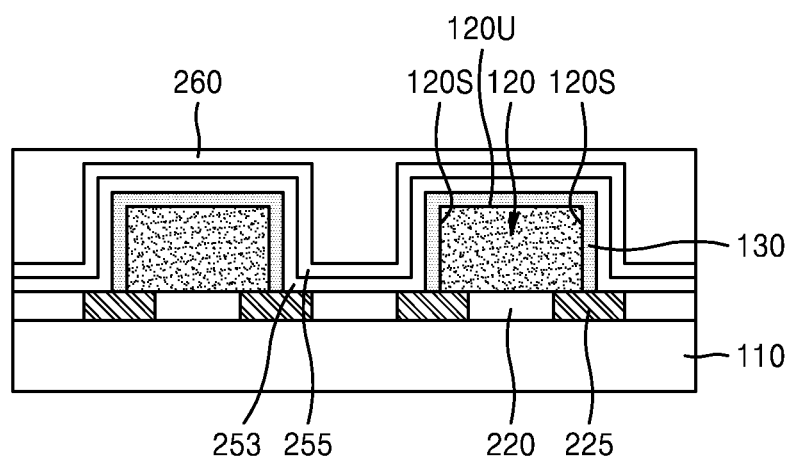
FIGS. 7A to 7C are cross-sectional views of a method of fabricating a device including a 2D material, according to an embodiment.
Figure 7B:
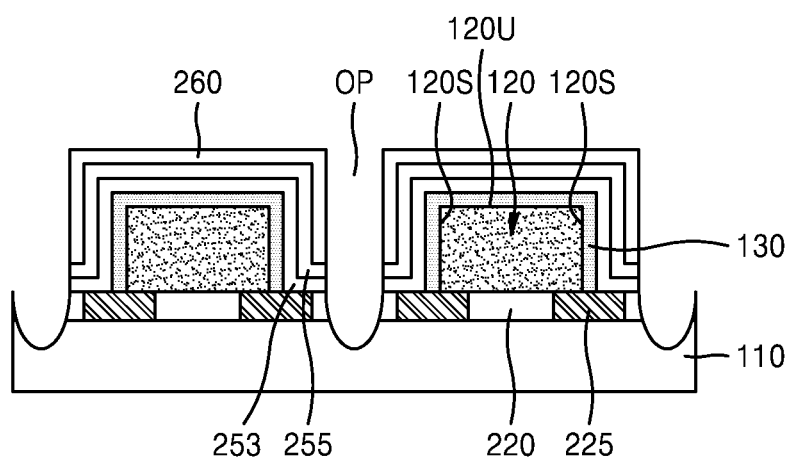
Figure 7C:
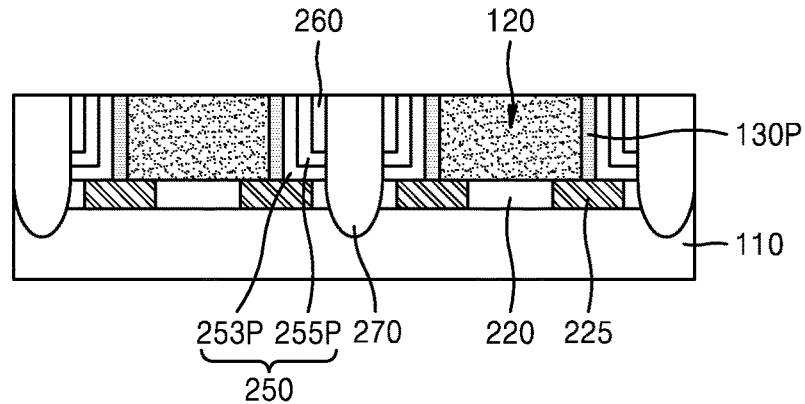

FIGS. 7A to 7C are cross-sectional views of a method of fabricating a device including a 2D material, according to an embodiment. Hereinafter, differences between the present embodiment and the embodiment described with reference to FIGS. 6A to 6I will be described.

According to the embodiment described with reference to FIGS. 6A to 6I, as shown in FIG. 6D, an operation of forming a cover layer 140 and a polishing process may be performed to remove a portion of a 2D material layer 130, which is formed on a top surface 120U of a material-pattern residual portion 120. In another case, according to the embodiment shown in FIGS. 7A to 7C, an additional operation of removing the portion of the 2D material layer 130, which is formed on the top surface 120U of the material-pattern residual portion 120, may not be needed. The portion of the 2D material layer 130, which is formed on the top surface 120U of the material-pattern residual portion 120, may be removed together during the polishing process for forming a gate structure 250.

Specifically, referring to FIG. 7A, after the 2D material layer 130 is formed due to the operation shown in FIG. 6C, portions of the 2D material layer 130, which are formed on a pair of opposite side surfaces 120R of the material-pattern residual portion 120, may be removed as shown in FIGS. 4A and 4B. Alternatively, as shown in FIGS. 5A and 5B, an operation of removing the material-pattern residual portion 120 and portions of the 2D material layer 130, which are formed on side surfaces 120S and 120R of the material-pattern residual portion 120, may be performed along a plurality of masks, which are orthogonal to the material-pattern residual portion 120 and spaced apart from each other. However, the portion of the 2D material layer 130, which is formed on the top surface 120U of the material-pattern residual portion 120, may not be removed but remain. That is, the operation of removing the portion of the 2D material layer 130, which is formed on the top surface 120U of the material-pattern residual portion 120, may be omitted.

Referring to FIG. 7B, an opening OP may be formed to penetrate a gate insulating layer 253, a gate electrode layer 255, and a filling insulating layer 260. A detailed description of the operation of FIG. 7B is the same as described with reference to FIG. 6F.

Referring to FIG. 7C, an isolation film 270, a gate structure 250, and a 2D material pattern 130P may be formed. A CMP process may be performed to expose the top surface 120U of the material-pattern residual portion 120. Unlike in the embodiment described with reference to FIGS. 6A to 6I, the portion of the 2D material layer 130, which is formed on the top surface 120U of the material-pattern residual portion 120, may be removed together with the gate insulating layer 253, the gate electrode layer 255, the filling insulating layer 260, and the isolation film 270 by using a polishing process. Thus, a pair of 2D material patterns 130P, which are separated from each other, may be formed on both opposite side surfaces 120S of the material-pattern residual portion 120. Next, the operations described with reference to FIGS. 6H and 6I may be performed.

FIGS. 8A to 8F are cross-sectional views of a method of fabricating a device including a 2D material, according to an embodiment. Hereinafter, differences between the present embodiment and the embodiment described with reference to FIGS. 6A to 6I will be described.

Figure 8A:
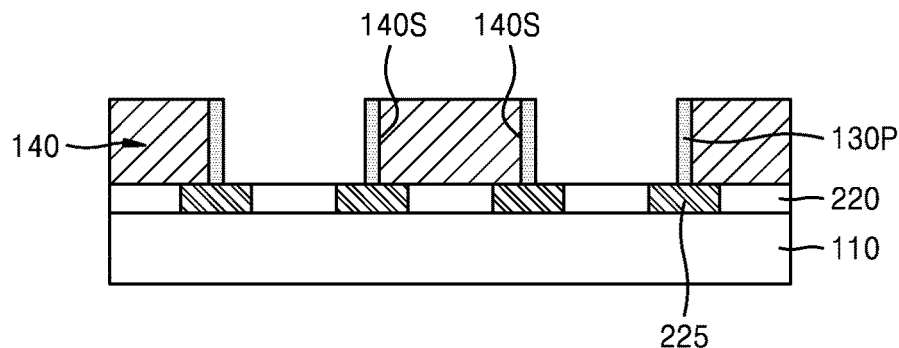
FIGS. 8A to 8F are cross-sectional views of a method of fabricating a device including a 2D material, according to an embodiment.

Referring to FIG. 8A, after the operation of forming the 2D material pattern 130P is performed as shown in FIG. 6D, the material-pattern residual portion 120 may be removed instead of the cover layer 140. After the material-pattern residual portion 120 is removed, a pair of 2D material patterns 130P may be located on a pair of opposite side surfaces 140S of the cover layer 140, respectively. When the cover layer 140 includes an insulating material, the cover layer 140 may function as an interlayer insulating layer of a semiconductor device.

Figure 8B:
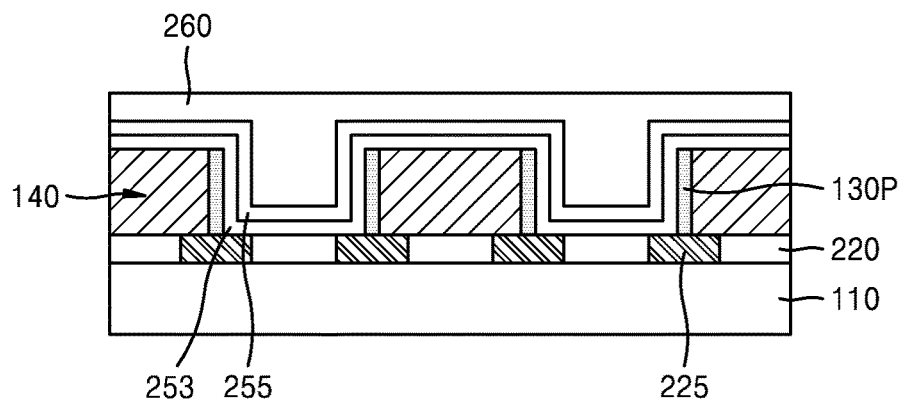

Referring to FIG. 8B, a gate insulating layer 253, a gate electrode layer 255, and a filling insulating layer 260 may be sequentially formed on the cover layer 140 and the 2D material pattern 130P to cover a space from which the material-pattern residual portion 120 is removed. A detailed description of the operation of FIG. 8B is the same as described with reference to FIG. 6E.

Figure 8C:
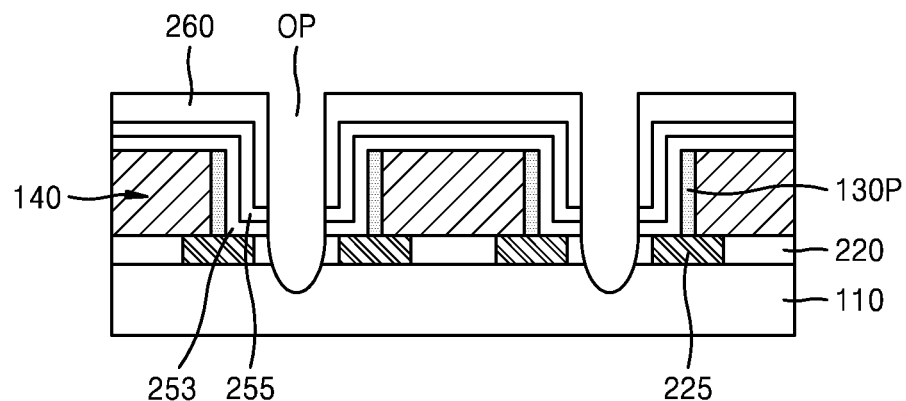

Referring to FIG. 8C, an opening OP may be formed to penetrate the gate insulating layer 253, the gate electrode layer 255, and the filling insulating layer 260. A detailed description of the operation of FIG. 8C is the same as described with reference to FIG. 6F.

Figure 8D:
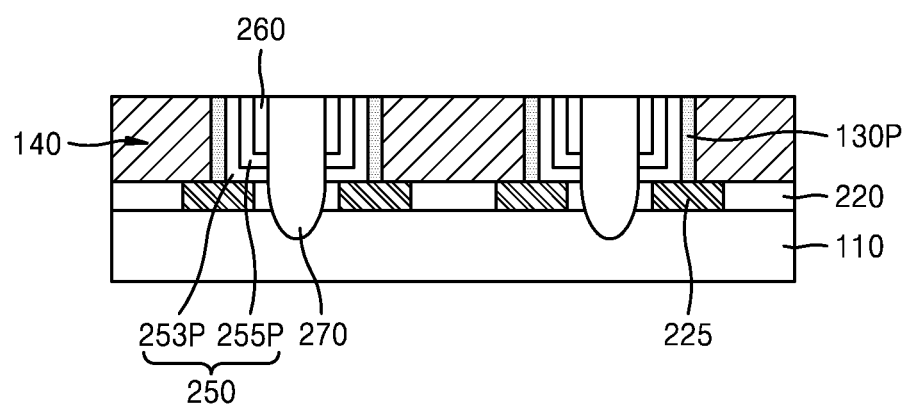

Referring to FIG. 8D, an isolation film 270 and a gate structure 250 may be formed. The gate structure 250 may be formed not in the space from which the cover layer 140 is removed, but in a space from which the material-pattern residual portion 120 (refer to FIG. 6D) is removed. A detailed description of the operation of FIG. 8D may be the same as described with reference to FIG. 6G.

Figure 8E:
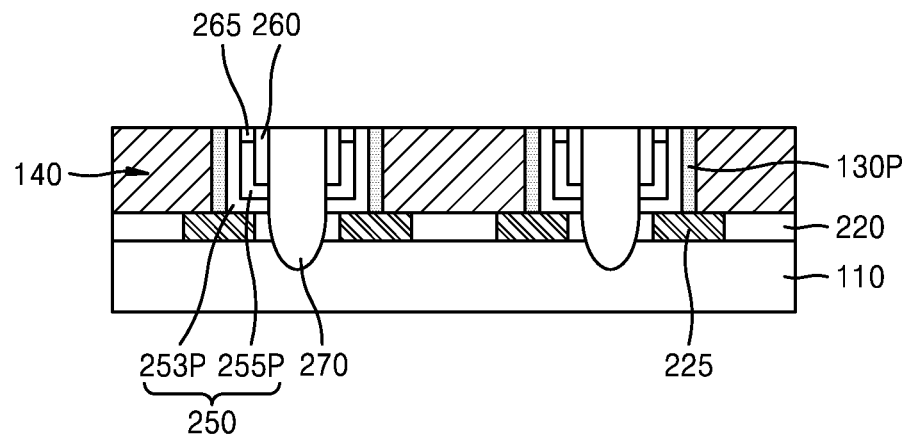

Referring to FIG. 8E, an upper portion of a gate electrode pattern 255P of the gate structure 250 may be removed, and a filling insulating pattern 265 may be formed in a space from which the upper portion of the gate electrode pattern 255P is removed. A detailed description of the operation of FIG. 8E is the same as described with reference to FIG. 6H.

Figure 8F:
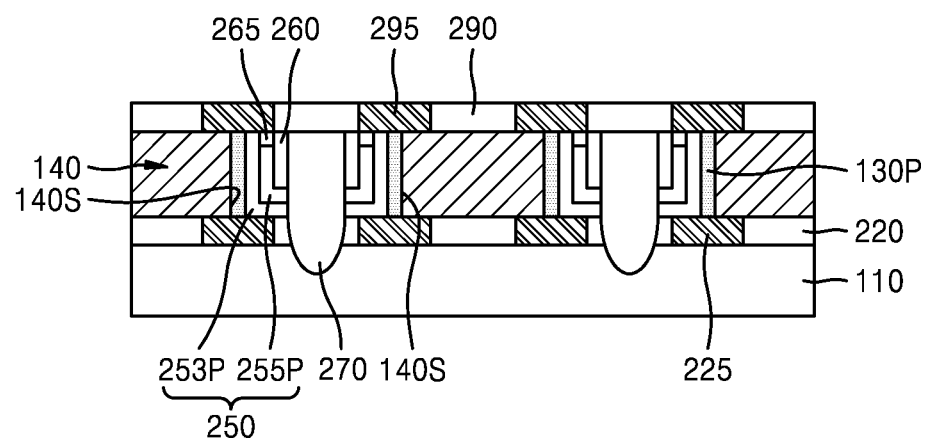

Referring to FIG. 8F, an upper electrode 295 and a second interlayer insulating layer 290 may be formed. A detailed description of the operation of FIG. 8F is the same as described with reference to FIG. 6I.

A semiconductor device fabricated according to an embodiment may include a pair of transistors, each of which may include the 2D material pattern 130P, a lower electrode 225, the upper electrode 295, and the gate structure 250. Unlike the semiconductor device fabricated with reference to FIGS. 6A to 6I, according to the embodiment, the pair of transistors may be spaced apart from each other with the cover layer 140 therebetween instead of the material-pattern residual portion 120 (refer to FIG. 6I). The 2D material pattern 130P may extend along the side surfaces 140S of the cover layer 140 instead of the material-pattern residual portion 120 (refer to FIG. 6I). The gate structure 250 including the gate electrode pattern 255P and the gate insulating pattern 253P may be located at a side of the 2D material pattern 130P, which is opposite to a side contacting the cover layer 140 of the 2D material pattern 130P.

Unlike in the semiconductor device fabricated according to the embodiment described with reference to FIGS. 6A to 6F, in the semiconductor device fabricated according to the embodiment described with reference to FIGS. 8A to 8F, the 2D material pattern 130P may be located not on a side surface of the material-pattern residual portion 120 (refer to FIG. 6I) but on the side surface 140S of the cover layer 140.

Figure 9A:
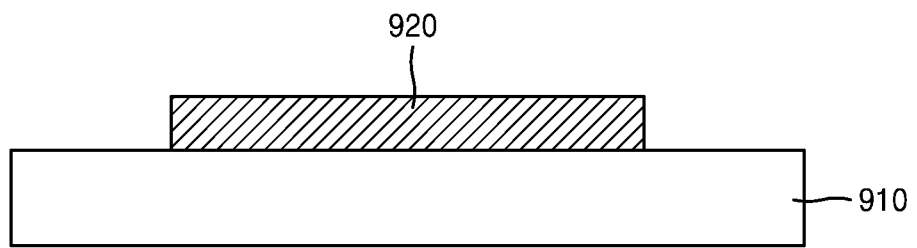
FIGS. 9A to 9C are cross-sectional views of a method of fabricating a device including a 2D material, according to an embodiment.
Figure 9B:
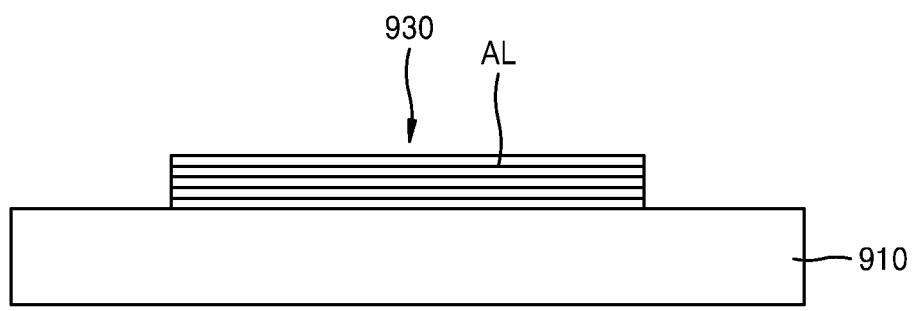
Figure 9C:
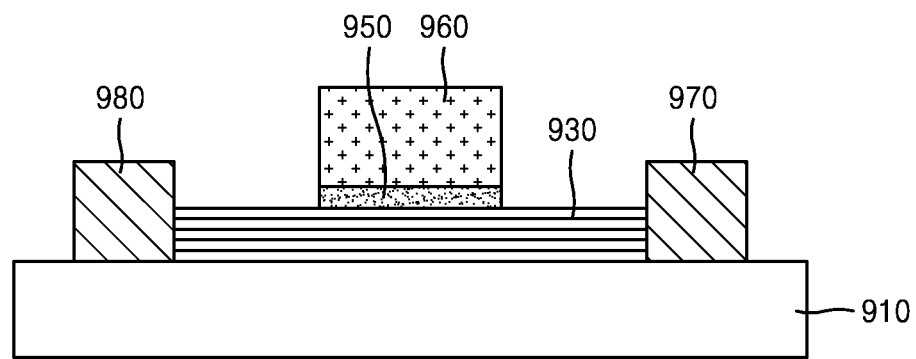

FIGS. 9A to 9C are cross-sectional views of a method of fabricating a device including a 2D material, according to an embodiment.

Referring to FIG. 9A, a material structure 920 may be formed on a substrate 910. The material structure 920 may include, for example, an amorphous transition metal oxide or a crystalline transition metal oxide. As used herein, the material structure 920 including the amorphous transition metal oxide may be referred to as an amorphous transition metal oxide structure. As used herein, the term "structure" may be interpreted as including a "pattern" and a "layer." For example, a material structure may include a material pattern and a material layer. In some embodiments, the material structure 920 may include an amorphous molybdenum dioxide ($MoO_2$). A material of the substrate 910 may be the same as the material of the substrate 110 discussed in the embodiment of FIGS. 1A though 5A.

Referring to FIG. 9B, the material structure 920 may be converted into a 2D material structure 930. The 2D material structure 930 may include a TMDC. For example, the TMDC may be formed by replacing oxygen contained in an amorphous transition metal oxide by a chalcogen element due to a chalcogenization reaction, such as a sulfurization reaction. The 2D material structure 930 including the TMDC may be referred to as a TMDC structure. The operation of replacing the material structure 920 by the 2D material structure 930 may include causing a reaction of the material structure 920 with a reactant including a chalcogen-group element. For example, the material structure 920 including amorphous molybdenum dioxide ($MoO_2$) may react with a reactant including sulfur (S) vapor. The 2D material structure 930 may have atomic layers AL that are substantially parallel to a surface of the 2D material structure 930. The atomic layers AL may be substantially parallel to a surface of the substrate 910. The 2D material structure 930 may be used as a channel of a semiconductor device. The number of atomic layers AL in the 2D material structure 930 may be in a range of one to several tens of atomic layers (e.g., in a range of 1 to 90, 1 to 30, 1 to 10, and/or 1-3 atomic layers), but is not particularly limited and may be adjusted.

Referring to FIG. 9C, a first electrode 980 and a second electrode 970 may be formed at opposite ends of the 2D material structure 930. Also, a gate dielectric structure 950 may be formed on the 2D material structure 930. In addition, a gate electrode 960 may be formed on the gate dielectric structure 950.

FIGS. 10A to 10E are cross-sectional views of a method of fabricating a device including a 2D material, according to an embodiment.

Figure 10A:
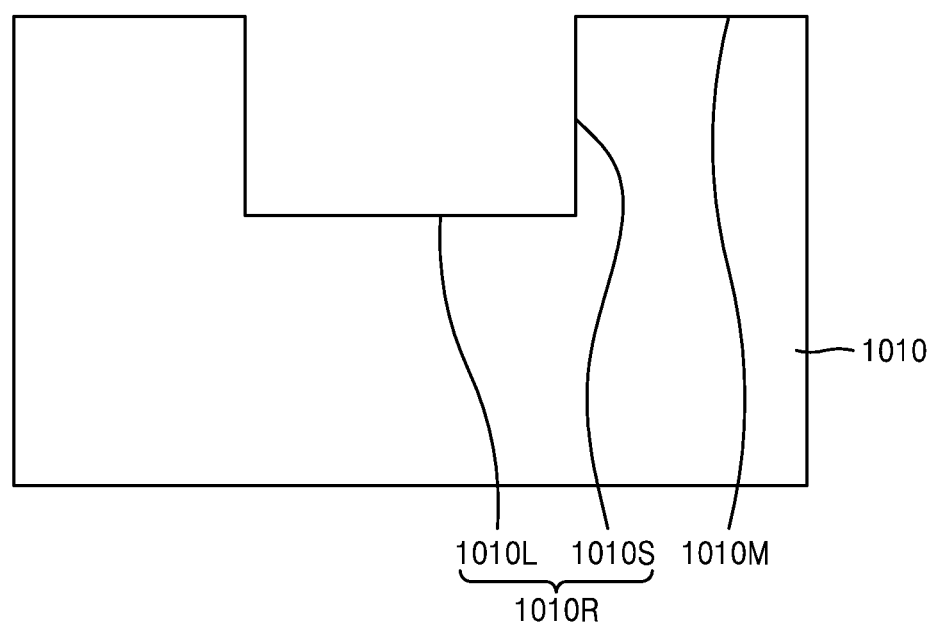
FIGS. 10A to 10E are cross-sectional views of a method of fabricating a device including a 2D material, according to an embodiment.

Referring to FIG. 10A, a substrate 1010 having a recess 1010R that is depressed from a main surface 1010M of the substrate 1010 may be provided. The recess 1010R of the substrate 1010 may have a bottom surface 1010L and a side surface 1010S. The bottom surface 1010L of the recess 1010R of the substrate 1010 may be substantially parallel to the main surface 1010M of the substrate 1010. The side surface 1010S of the recess 1010R of the substrate 1010 may be substantially perpendicular to the main surface 1010M of the substrate 1010. A material of the substrate 1010 may be the same as the material of the substrate 110 discussed in the embodiment of FIGS. 1A though 5A.

Figure 10B:
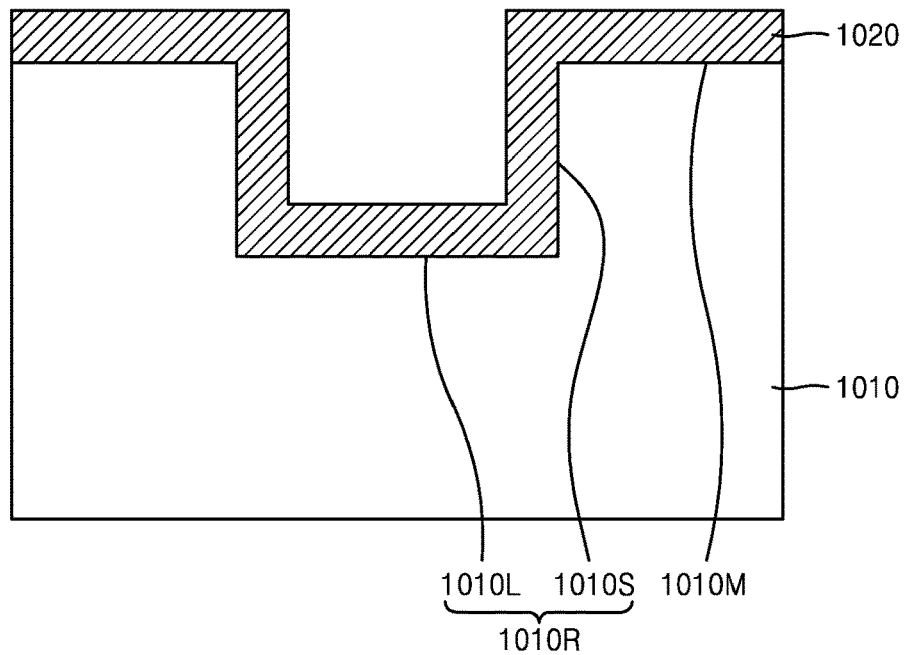

Referring to FIG. 10B, the substrate 1010 may be covered with a material layer 1020. That is, the main surface 1010M of the substrate 1010, a bottom surface 1010U of the recess 1010R of the substrate 1010, and the side surface 1010S of the recess 1010R of the substrate 1010 may be covered with the material layer 1020. In some embodiments, the material layer 1020 may include an amorphous transition metal oxide, and the material layer 1020 including the amorphous transition metal oxide may be referred to as an amorphous transition metal oxide structure.

Figure 10C:
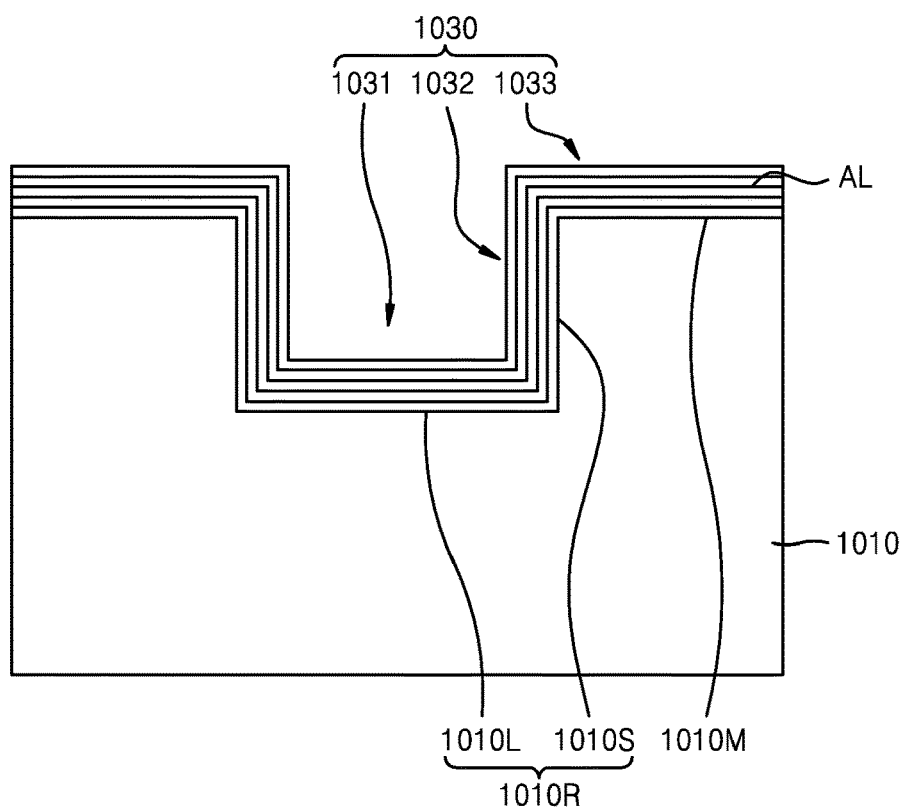

Referring to FIG. 10C, the material layer 1020 (refer to FIG. 10B) may be converted into a 2D material layer 1030. In some embodiments, the 2D material layer 1030 may include a TMDC. For example, the TMDC may be formed by replacing oxygen contained in amorphous transition metal oxide by a chalcogen element due to a chalcogenization reaction, such as a sulfurization reaction. The 2D material layer 1030 including the TMDC may be referred to as a TMDC structure. The 2D material layer 1030 may include a first portion 1031 on the bottom surface 1010L of the recess 1010R of the substrate 1010, a second portion 1032 on the side surface 1010S of the recess 1010R of the substrate 1010, and a third portion 1033 on the main surface 1010M of the substrate 1010. In the first portion 1031 of the 2D material layer 1030, the atomic layers AL may be substantially parallel to the bottom surface 1010L of the recess 1010R of the substrate 1010. In the second portion 1032 of the 2D material layer 1030, the atomic layers AL may be substantially parallel to the side surface 1010S of the recess 1010R of the substrate 1010. In the third portion 1033 of the 2D material layer 1030, the atomic layers AL may be substantially parallel to the main surface 1010M of the substrate 1010. In some embodiments, the side surface 1010S of the recess 1010R of the substrate 1010 may be substantially perpendicular to the main surface 1010M of the substrate 1010. In this case, the atomic layers AL may be substantially perpendicular to the main surface 1010M of the substrate 1010 in the second portion 1032 of the 2D material layer 1030.

Figure 10D:
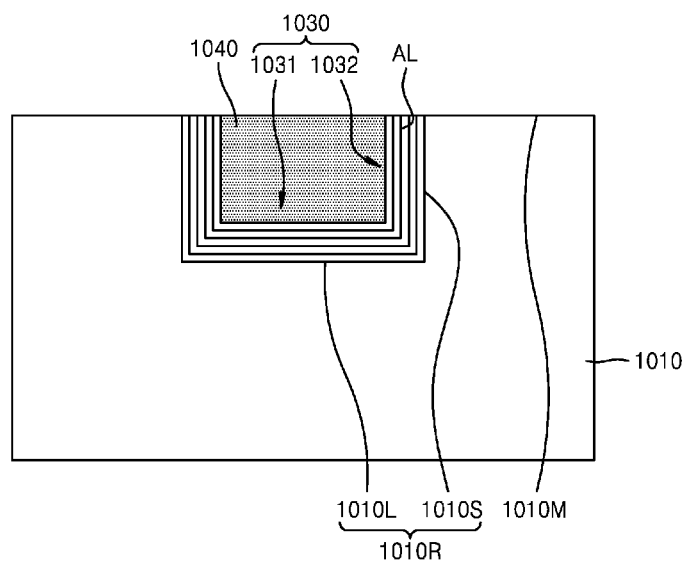

Referring to FIG. 10D, the third portion 1033 (refer to FIG. 10C) of the 2D material layer 1030 may be removed. The operation of removing the third portion 1033 (refer to FIG. 10C) of the 2D material layer 1030 may include forming a cover layer 1040 on the 2D material layer 1030 and polishing a portion of the cover layer 1040 and the third portion 1033 (refer to FIG. 10C) of the 2D material layer 1030 to expose the main surface 1010M of the substrate 1010. The 2D material layer 1030 may be used as a channel of a semiconductor device.

Figure 10E:
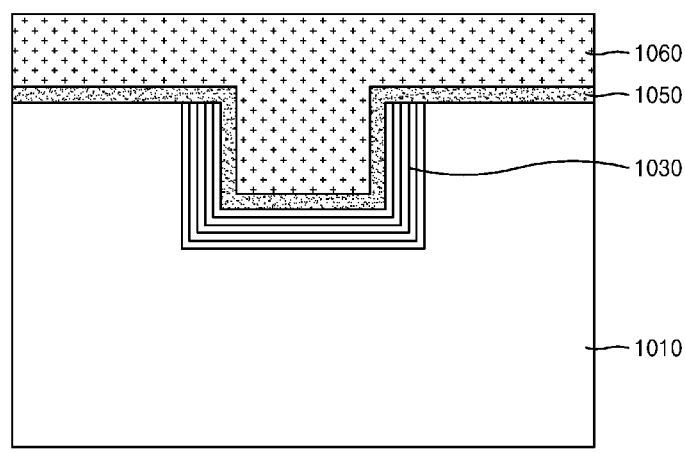

Referring to FIG. 10E, the cover layer 1040 (refer to FIG. 10D) may be removed. Then, a gate dielectric structure 1050 may be formed on the 2D material layer 1030. In addition, a gate electrode 1060 may be formed on the gate dielectric structure 1050.

Figure 11A:
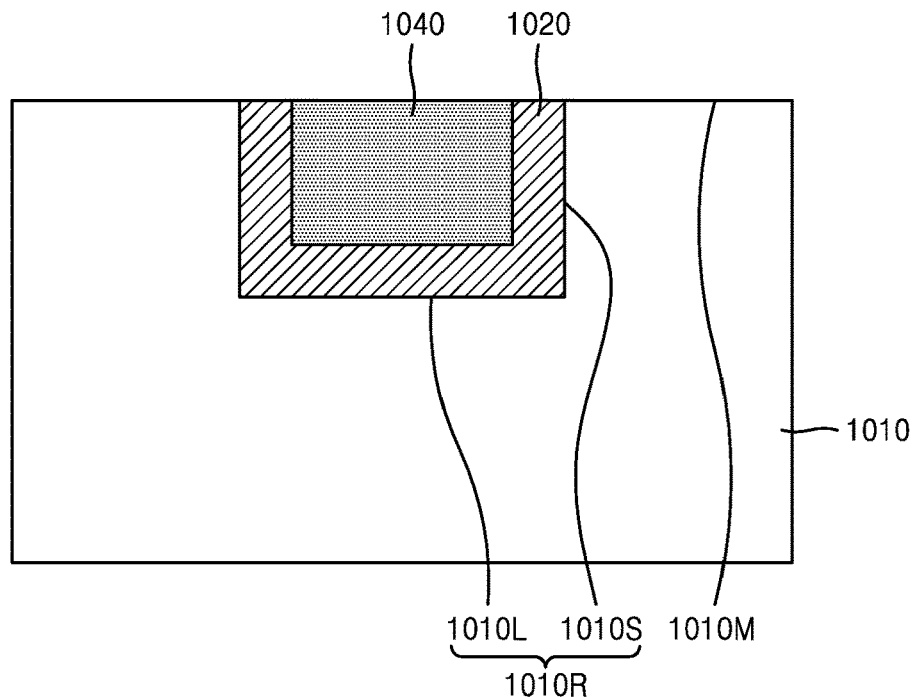
FIGS. 11A and 11B are cross-sectional views of a method of fabricating a device including a 2D material, according to an embodiment.
Figure 11B:
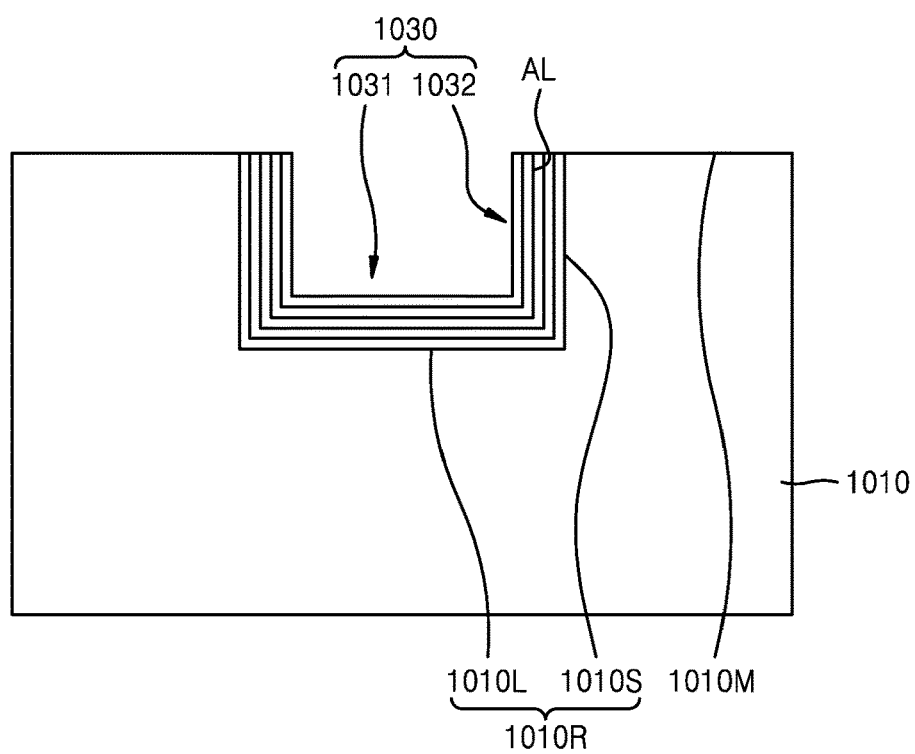

FIGS. 11A and 11B are cross-sectional views of a method of fabricating a device including a 2D material, according to an embodiment.

As shown in FIGS. 10A and 10B, a material layer 1020 may be formed on a substrate having a recess 1010R.

Referring to FIG. 11A, a portion of the material layer 1020, which is formed on a main surface 1010M of the substrate 1010, may be removed. For example, the material layer 1020 may be covered with a cover layer 1040, and an upper portion of the cover layer 1040 and the portion of the material layer 1020, which is formed on the main surface 1010M of the substrate 1010, may be polished to expose the main surface 1010M of the substrate 1010. Thereafter, the cover layer 1040 may be removed.

Referring to FIGS. 11A and 11B, the material layer 1020 may be replaced by a 2D material layer 1030. The 2D material layer 1030 may have a first portion 1031 on a bottom surface 1010L of the recess 1010R of the substrate 1010 and a second portion 1032 on a side surface 1010S of the recess 1010R of the substrate 1010.

FIGS. 12A to 12E are cross-sectional views of a method of fabricating a device including a 2D material, according to an embodiment.

Figure 12A:
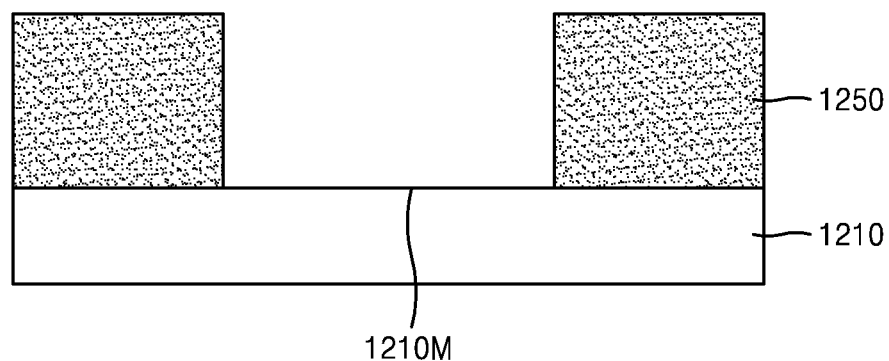
FIGS. 12A to 12E are cross-sectional views of a method of fabricating a device including a 2D material, according to an embodiment.

Referring to FIG. 12A, a material pattern 1250 may be formed on a substrate 1210. A material of the substrate 1210 may be the same as the material of the substrate 110 discussed in the embodiment of FIGS. 1A though 5A.

Figure 12B:
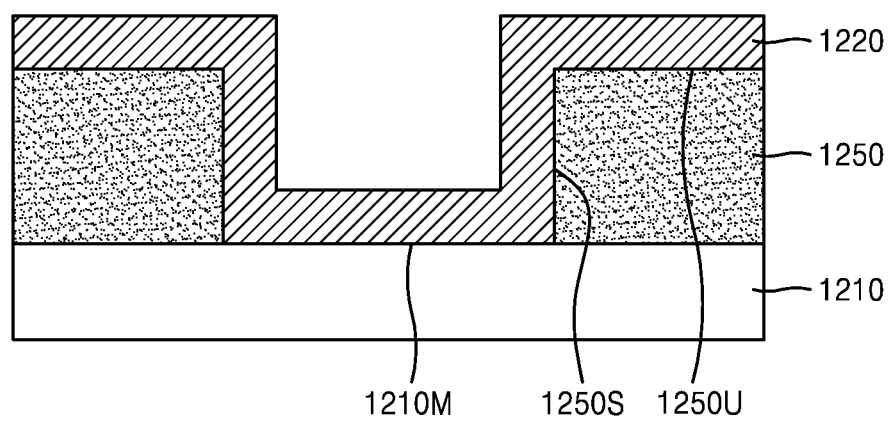

Referring to FIG. 12B, a main surface 1210M of the substrate 1210 and a side surface 1250S and a top surface 1250U of the material pattern 1250 may be covered with a material layer 1220. In some embodiments, the material layer 1220 may include an amorphous transition metal oxide, and the material layer 1220 including the amorphous transition metal oxide may be referred to as an amorphous transition metal oxide structure.

Figure 12C:
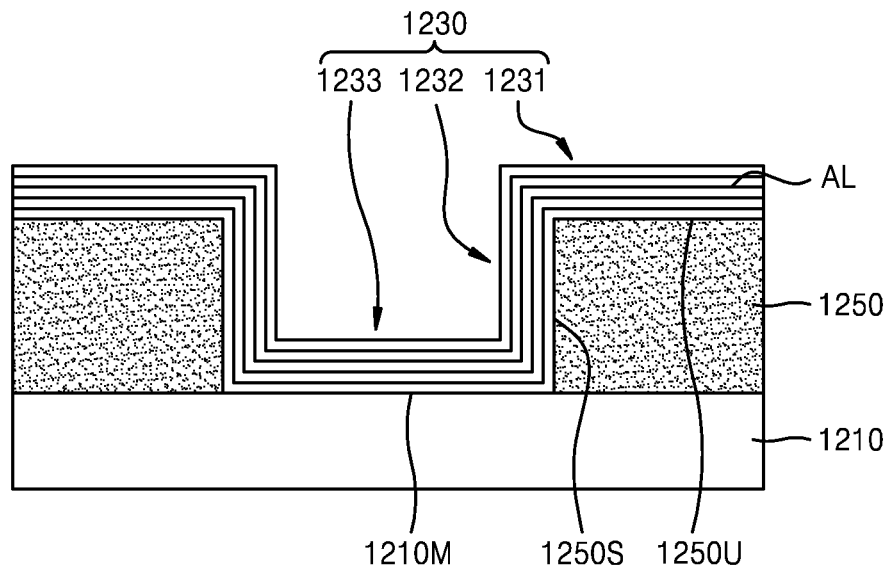

Referring to FIG. 12C, the material layer 1220 (refer to FIG. 12B) may be replaced by a 2D material layer 1230. In some embodiments, the 2D material layer 1230 may include a TMDC, and the 2D material layer 1230 including the TMDC may be referred to as a TMDC structure. The 2D material layer 1230 may include a first portion 1231 on the top surface 1250U of the material pattern 1250, a second portion 1232 on the side surface 1250S of the material pattern 1250, and a third portion 1233 on the main surface 1210M of the substrate 1210. Atomic layers AL may be substantially parallel to the top surface 1250U of the material pattern 1250 in the first portion 1231. The atomic layers AL may be substantially parallel to the side surface 1250S of the material pattern 1250 in the second portion 1232. The atomic layers AL may be substantially parallel to the main surface 1210M of the substrate 1210 in the third portion 1233. In some embodiments, the side surface 1250S of the material pattern 1250 may be substantially perpendicular to the main surface 1210M of the substrate 1210. In this case, the atomic layers AL may be substantially perpendicular to the main surface 1210M of the substrate 1210 in the second portion 1232 of the 2D material layer 1230. The number of atomic layers AL in the 2D material structure 1230 may be in a range of one to several tens of atomic layers (e.g., in a range of 1 to 90, 1 to 30, 1 to 10, and/or 1-3 atomic layers), but is not particularly limited and may be adjusted.

Figure 12D:
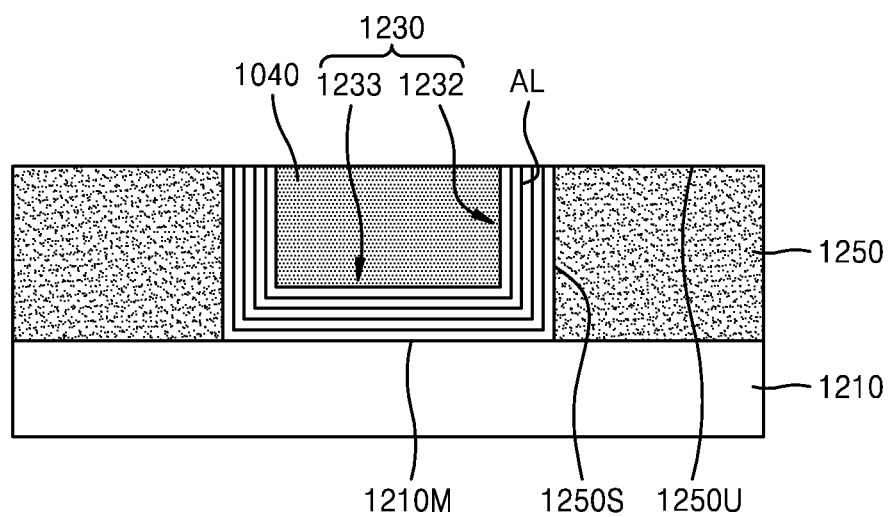

Referring to FIG. 12D, the first portion 1231 (refer to FIG. 12C) of the 2D material layer 1230 may be removed. The process of removing the first portion 1231 (refer to FIG. 12C) of the 2D material layer 1230 may include covering the 2D material layer 1230 with a cover layer 1040 and polishing an upper portion of the cover layer 1040 and the first portion 1231 (refer to FIG. 12C) of the 2D material layer 1230, which is on the top surface 1250U of the material pattern 1250, to expose the top surface 1250U of the material pattern 1250.

Figure 12E:
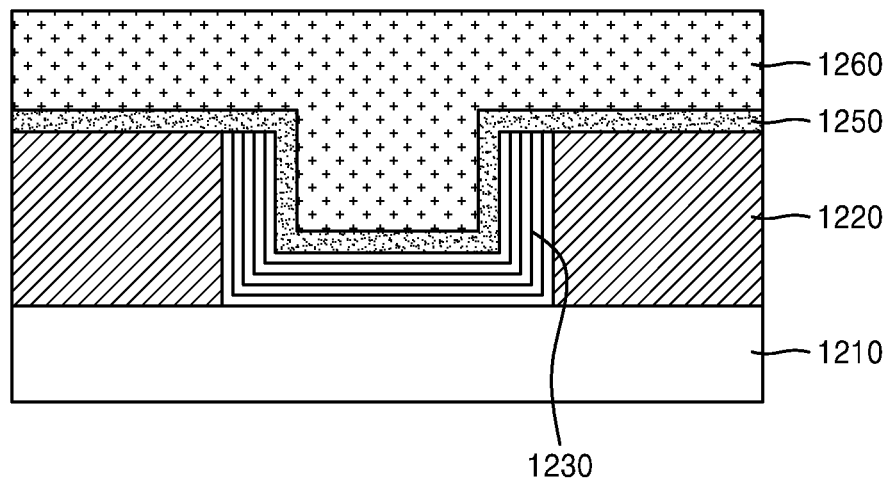

Referring to FIG. 12E, the cover layer 1040 (refer to FIG. 12D) may be removed. Then, a gate dielectric structure 1250 may be formed on the 2D material layer 1230. In addition, a gate electrode 1260 may be formed on the gate dielectric structure 1250.

Figure 13A:
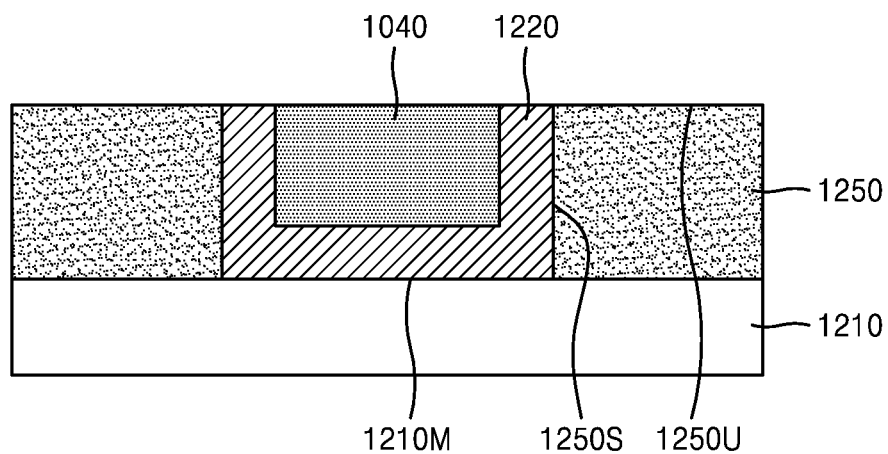
FIGS. 13A and 13B are cross-sectional views of a method of fabricating a device including a 2D material, according to an embodiment.
Figure 13B:
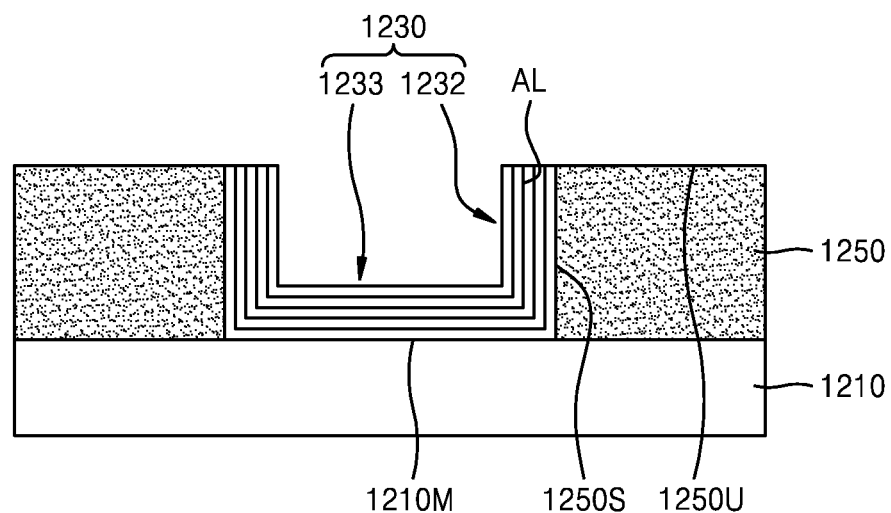

FIGS. 13A and 13B are cross-sectional views of a method of fabricating a device including a 2D material, according to an embodiment.

Referring to FIGS. 13A and 13B, a material pattern 1250 and a material layer 1220 may be formed on a substrate 1210. Referring to FIG. 13A, a portion of the material layer 1220, which is on a top surface 1250U of the material pattern 1250, may be removed. For example, the material layer 1220 may be covered with a cover layer 1040, and an upper portion of the cover layer 1040 and a portion of the material layer 1220, which is on the top surface 1250U of the material pattern 1250, may be polished. Thereafter, the cover layer 1040 may be removed.

Referring to FIG. 13B, the material layer 1220 (refer to FIG. 13A) may be replaced by a 2D material layer 1230. The 2D material layer 1230 may include a second portion 1232 on a side surface 1250S of the material pattern 1250 and a third portion 1233 on a main surface 1210M of the substrate 1210.

FIGS. 14A to 14D are cross-sectional views of a method of fabricating a device including a 2D material, according to an embodiment.

Figure 14A:
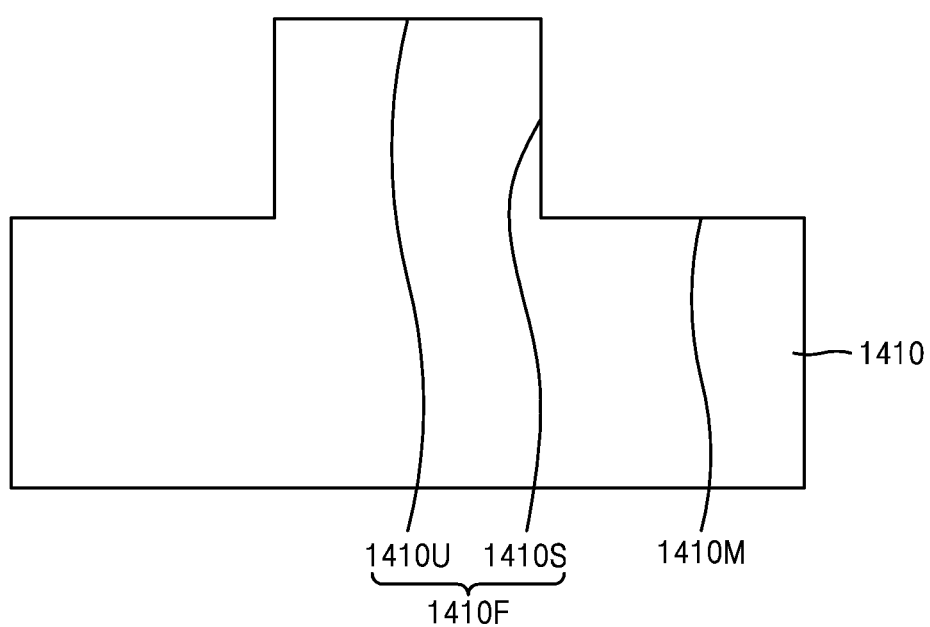
FIGS. 14A to 14D are cross-sectional views of a method of fabricating a device including a 2D material, according to an embodiment.

Referring to FIG. 14A, a substrate 1410 having a fin 1410F protruding from a main surface 1410M of the substrate 1410 may be provided. The fin 1410F of the substrate 1410 may have a top surface 1410U and a side surface 1410S. The top surface 1410U of the fin 1410F of the substrate 1410 may be substantially parallel to the main surface 1410M of the substrate 1410. The side surface 1410S of the fin 1410F of the substrate 1410 may be substantially perpendicular to the main surface 1410M of the substrate 1410.

Figure 14B:
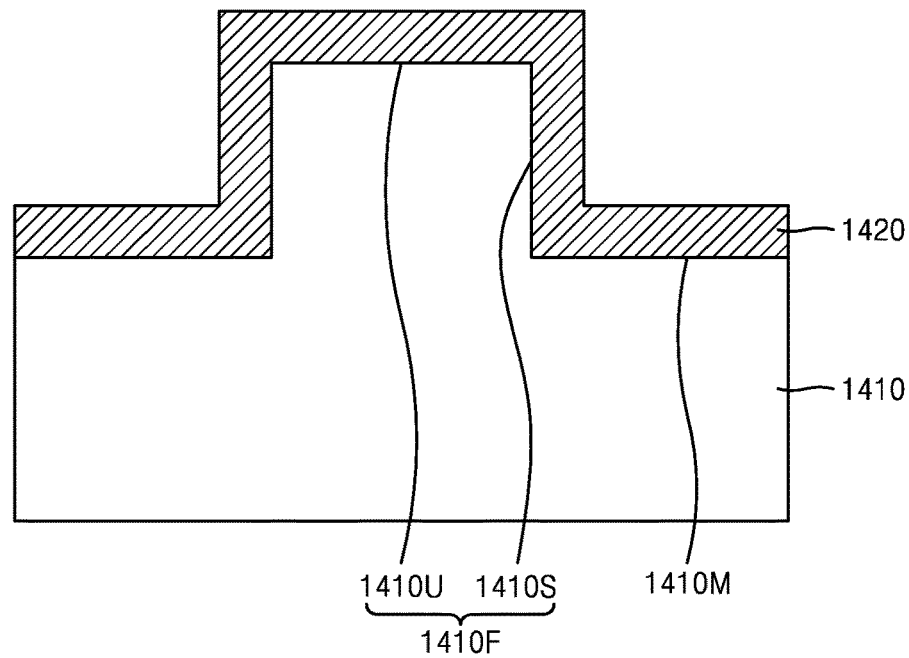

Referring to FIG. 14B, the substrate 1410 may be covered with a material layer 1420. That is, the main surface 1010M of the substrate 1410, the top surface 1410U of the fin 1410F of the substrate 1410, and the side surface 1410S of the fin 1410F of the substrate 1410 may be covered with the material layer 1420. In some embodiments, the material layer 1420 may include an amorphous transition metal oxide, and the material layer 1420 including the amorphous transition metal oxide may be referred to as an amorphous transition metal oxide structure.

Figure 14C:
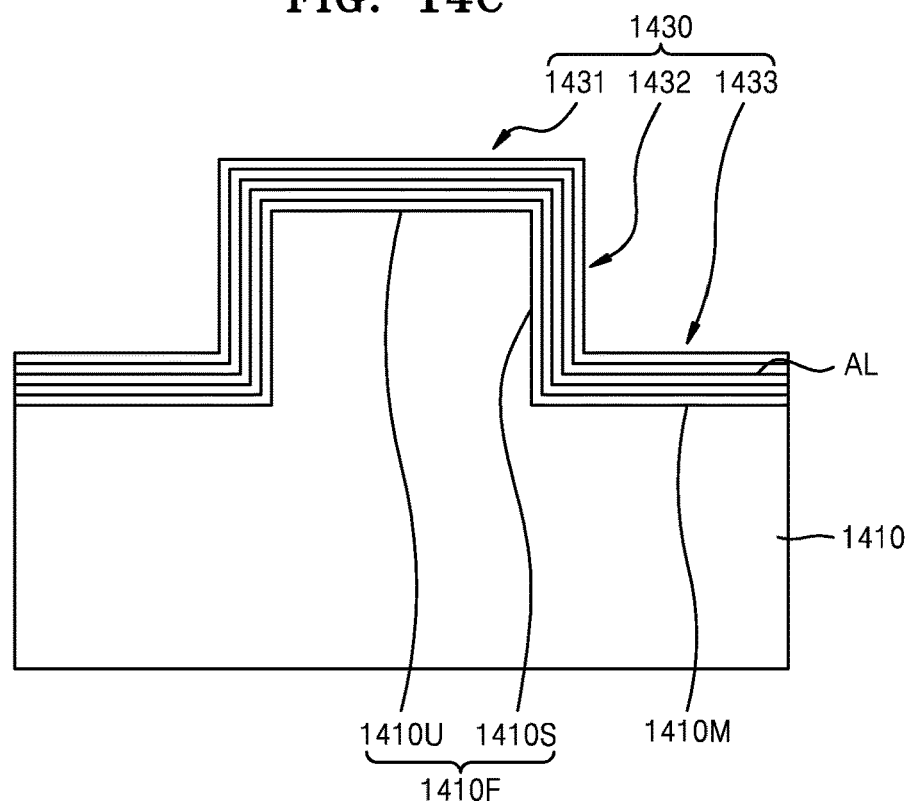

Referring to FIG. 14C, the material layer 1420 (refer to FIG. 14B) may be replaced by a 2D material layer 1430. In some embodiments, the 2D material layer 1430 may include a TMDC, and the 2D material layer 1430 including the TMDC may be referred to as a TMDC structure. The 2D material layer 1430 may include a first portion 1431 on the top surface 1410U of the fin 1410F of the substrate 1410, a second portion 1432 on the side surface 1410S of the fin 1410F of the substrate 1410, and a third portion 1433 on the main surface 1410M of the substrate 1410. In the first portion 1431 of the 2D material layer 1430, atomic layers AL may be substantially parallel to the top surface 1410U of the fin 1410F of the substrate 1410. In the second portion 1432 of the 2D material layer 1430, the atomic layers AL may be substantially parallel to the side surface 1410S of the fin 1410F of the substrate 1410. In the third portion 1433 of the 2D material layer 1430, the atomic layers AL may be substantially parallel to the main surface 1410M of the substrate 1410. In some embodiments, the side surface 1410S of the fin 1410F of the substrate 1410 may be substantially perpendicular to the main surface 1410M of the substrate 1410. In this case, the atomic layers AL may be substantially perpendicular to the main surface 1410M of the substrate 1410 in the second portion 1432 of the 2D material layer 1430.

Figure 14D:
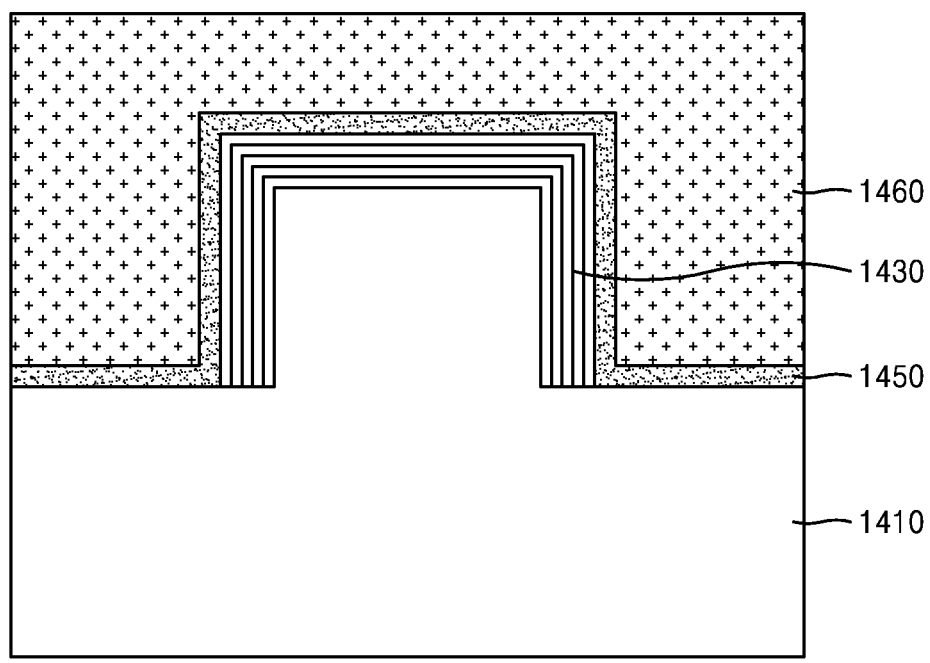

Referring to FIG. 14D, the third portion 1433 (refer to FIG. 14C) of the 2D material layer 1430 may be removed. Then, a gate dielectric structure 1450 may be formed on the 2D material layer 1430. In addition, a gate electrode 1460 may be formed on the gate dielectric structure 1450.

FIGS. 15A to 15D are cross-sectional views of a method of fabricating a device including a 2D material, according to an embodiment.

Figure 15A:
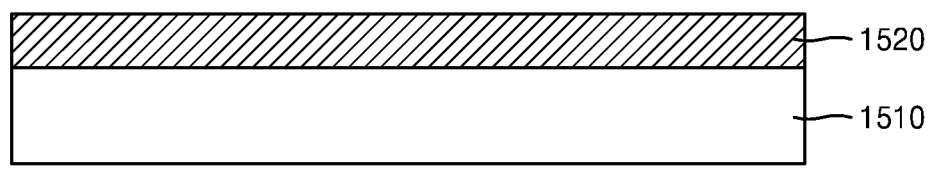
FIGS. 15A to 15D are cross-sectional views of a method of fabricating a device including a 2D material, according to an embodiment.

Referring to FIG. 15A, a material layer 1520 may be formed on a substrate 1510. In some embodiments, the material layer 1520 may include an amorphous transition metal oxide, and the material layer 1520 including the amorphous transition metal oxide may be referred to as an amorphous transition metal oxide layer.

Figure 15B:
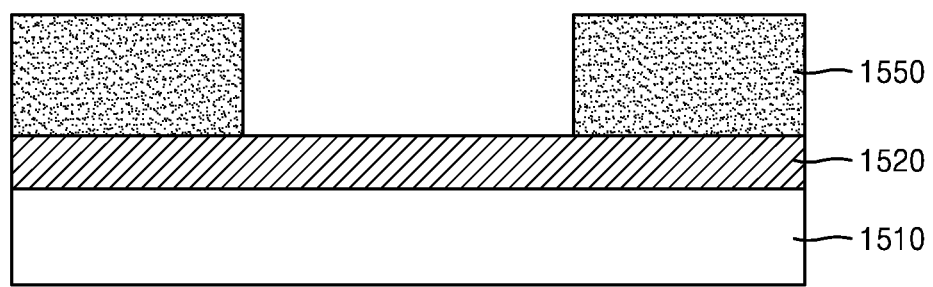

Referring to FIG. 15B, a material pattern 1550 may be formed on a portion of the material layer 1520.

Figure 15C:
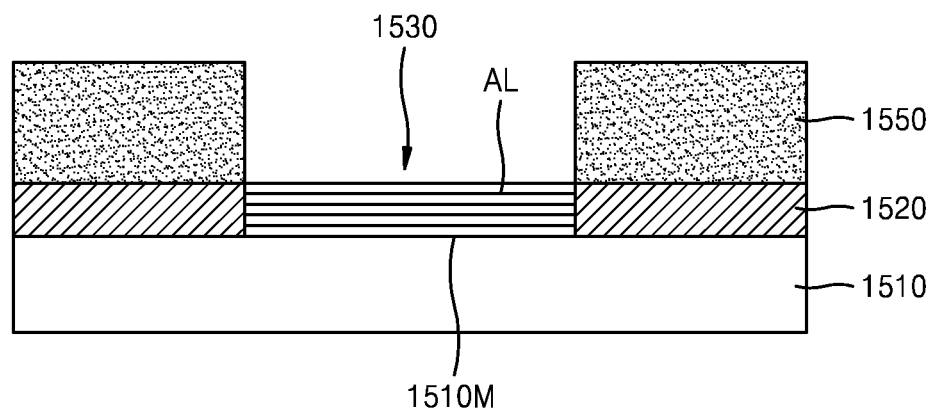

Referring to FIG. 15C, a portion of the material layer 1520, which is not covered with the material pattern 1550, may be replaced by a 2D material pattern 1530. In some embodiments, the 2D material pattern 1530 may include a TMDC, and the 2D material pattern 1530 including the TMDC may be referred to as a TMDC pattern. The 2D material pattern 1530 may have atomic layers, which are substantially parallel to a main surface 1510M of the substrate 1510.

Figure 15D:
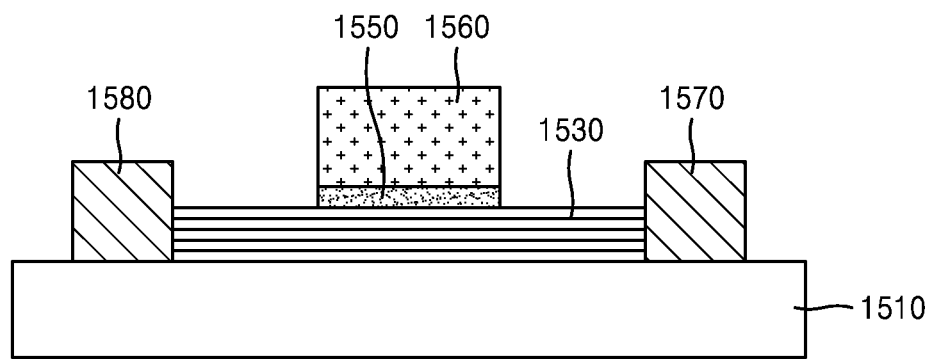

Referring to FIG. 15D, the remaining material layer 1520 (refer to FIG. 15C) and the material pattern 1550 (refer to FIG. 15C) may be removed. A first electrode 1580 and a second electrode 1570 may be formed at opposite ends of the 2D material structure 1530. Also, a gate dielectric structure 1550 may be formed on the 2D material structure 1530. In addition, a gate electrode 1560 may be formed on the gate dielectric structure 1550.

While inventive concepts has been particularly shown and described with reference to embodiments thereof, it will be understood that various changes in form and details may be made therein without departing from the spirit and scope of the following claims.

What is claimed is:

1. A method of fabricating a device comprising a two-dimensional (2D) material, the method comprising:
    forming a transition metal oxide pattern on a substrate; and
    forming a transition metal dichalcogenide layer on a top surface and a side surface of a residual portion of the transition metal oxide pattern,
    the forming the transition metal dichalcogenide layer including replacing a surface portion of the transition metal oxide pattern with the transition metal dichalcogenide layer
    the transition metal dichalcogenide layer including at least one atomic layer that is substantially parallel to a surface of the residual portion of the transition metal oxide pattern.

2. The method of claim 1, wherein the transition metal oxide pattern includes crystalline molybdenum dioxide.

3. The method of claim 1, wherein
    the transition metal oxide pattern includes a transition metal oxide, and
    the forming the transition metal dichalcogenide layer is performed at a temperature lower than a sublimation temperature of the transition metal oxide in the transition metal oxide pattern.

4. The method of claim 1, wherein the forming the transition metal dichalcogenide layer comprises reacting the transition metal oxide pattern with a reactant containing a chalcogen-group element.

5. The method of claim 4, wherein the reactant includes sulfur vapor.

6. The method of claim 1, wherein
    the transition metal dichalcogenide layer includes a first portion and a second portion,
    the first portion is on the top surface of the residual portion of the transition metal oxide pattern, the second portion is on the side surface of the residual portion of the transition metal oxide pattern, the at least one atomic layer is substantially parallel to a main surface of the substrate in the first portion of the transition metal dichalcogenide layer, and the at least one atomic layer is substantially perpendicular to a main surface of the substrate in the second portion of the transition metal dichalcogenide layer.

7. The method of claim 1, further comprising:

removing a first portion of the transition metal dichalcogenide layer, wherein the transition metal dichalcogenide layer includes the first portion and a second portion, the first portion is on the top surface of the residual portion of the transition metal oxide pattern, and the second portion is on the side surface of the transition metal oxide pattern.

8. A method of fabricating a device comprising a two-dimensional (2D) material, the method comprising:

forming a material pattern on a substrate; and forming a 2D material layer on a residual portion of the material pattern, the forming the 2D material layer including replacing a surface portion of the material pattern with 2D material layer; and forming a pair of 2D material patterns on a pair of opposite side surfaces of the residual portion of the material pattern, the forming the pair of 2D material patterns including removing a portion of the 2D material layer.

9. The method of claim 8, wherein the 2D material layer includes at least one atomic layer parallel to a surface of the residual portion of the material pattern.

10. The method of claim 8, wherein each of the pair of opposite side surfaces of the residual portion of the material pattern is substantially perpendicular to the substrate, and each of the pair of 2D material patterns has at least one atomic layer that is substantially perpendicular to the substrate.

11. The method of claim 8, wherein the forming the 2D material layer is performed in a temperature range lower than a sublimation temperature of a material included in the material pattern.

12. The method of claim 8, wherein the forming the pair of 2D material patterns includes removing a portion of the 2D material layer that is formed on a top surface of the residual portion of the material pattern.

13. The method of claim 12, wherein the removing the portion of the 2D material layer that is formed on the top surface of the residual portion of the material pattern, includes:

covering the substrate and the 2D material layer with a cover layer; and exposing the residual portion of the material pattern, the exposing the residual portion of the material pattern including polishing an upper portion of the cover layer and the portion of the 2D material layer that is formed on the top surface of the residual portion of the material pattern.

14. The method of claim 12, wherein the forming the pair of 2D material patterns further includes removing portions of the 2D material layer that are formed on another pair of opposite side surfaces of the residual portion of the material pattern.

15. The method of claim 8, wherein the 2D material layer includes a transition metal dichalcogenide.

16. The method of claim 8, wherein the material pattern includes crystalline molybdenum dioxide.

17. A method of fabricating a device comprising a two-dimensional (2D) material, the method comprising:

forming a pair of lower electrodes on a substrate;

forming a material pattern in contact with the pair of lower electrodes;

forming a 2D material layer on a residual portion of the material pattern, the forming the 2D material layer including replacing a surface portion of the material pattern with the 2D material layer;

forming a pair of 2D material patterns and a pair of gate structures contacting the pair of 2D material patterns, the pair of 2D material patterns extending from the pair of lower electrodes along a pair of opposite side surfaces of the residual portion of the material pattern; and forming a pair of upper electrodes on end parts of the pair of 2D material patterns that are opposite to end portions of the pair of 2D material patterns contacting the pair of lower electrodes.

18. The method of claim 17, wherein the forming the pair of 2D material patterns and the pair of gate structures includes:

covering the 2D material layer with a cover layer;

exposing the residual portion of the material pattern, the exposing the residual portion of the material pattern including polishing an upper portion of the cover layer and a portion of the 2D material layer on a top surface of the residual portion of the material pattern;

removing the cover layer; and forming the pair of gate structures in a space from which the cover layer is removed.

19. The method of claim 17, wherein the forming of the pair of 2D material patterns and the pair of gate structures comprises:

covering the 2D material layer with a cover layer;

polishing an upper portion of the cover layer and a portion of the 2D material layer on a top surface of the residual portion of the material pattern to expose the residual portion of the material pattern;

removing the residual portion of the material pattern; and forming the pair of gate structures in a space from which the residual portion of the material pattern is removed.

20. The method of claim 17, wherein the forming the pair of 2D material patterns and the pair of gate structures comprises:

sequentially forming a gate insulating layer, a gate electrode layer, and a filling insulating layer on the 2D material layer; and removing an upper portion of the filling insulating layer, an upper portion of the gate electrode layer, an upper portion of the gate insulating layer, and a portion of the 2D material layer on a top surface of the residual portion of the material pattern to expose the residual portion of the material pattern.

\* \* \* \* \*